(12) United States Patent
Meyer

(10) Patent No.: US 9,768,725 B2
(45) Date of Patent: Sep. 19, 2017

(54) REDUNDANT ELECTRICAL ARCHITECTURE FOR PHOTOVOLTAIC MODULES

(71) Applicant: TENKSOLAR, INC., Minneapolis, MN (US)

(72) Inventor: Dallas W. Meyer, Prior Lake, MN (US)

(73) Assignee: TENKSOLAR, INC., Minneapolis, MN (US)

( * ) Notice: Subject to any disclaimer, the term of this patent is extended or adjusted under 35 U.S.C. 154(b) by 206 days.

(21) Appl. No.: 14/532,305

(22) Filed: Nov. 4, 2014

(65) Prior Publication Data
US 2015/0047689 A1    Feb. 19, 2015

Related U.S. Application Data

(62) Division of application No. 12/357,260, filed on Jan. 21, 2009, now Pat. No. 8,933,320.
(Continued)

(51) Int. Cl.
*H02S 50/00* (2014.01)
*H01L 31/042* (2014.01)
(Continued)

(52) U.S. Cl.
CPC ........ *H02S 50/00* (2013.01); *H01L 31/02008* (2013.01); *H01L 31/042* (2013.01);
(Continued)

(58) Field of Classification Search
CPC ...................................................... H02S 50/00
See application file for complete search history.

(56) References Cited

U.S. PATENT DOCUMENTS 2,554,225 A * 5/1951 Taylor ..................... H01J 29/45
                                                    136/290
3,094,439 A    6/1963 Mann et al.
(Continued)

FOREIGN PATENT DOCUMENTS

AU    WO 2007128060 A1 * 11/2007 ......... G01N 21/6489
CN            1388636        1/2003
(Continued)

OTHER PUBLICATIONS

PV Lighthouse resource, available online at https://www2.pvlighthouse.com.au/resources/courses/altermatt/The%20Solar%20Spectrum/Intensity%20or%20photon%20flux.aspx, accessed Jan. 5, 2017.*
(Continued)

*Primary Examiner* — David Porta
*Assistant Examiner* — Jeremy S Valentiner
(74) *Attorney, Agent, or Firm* — Maschoff Brennan

(57) ABSTRACT

One example embodiment includes a PV module comprising a conductive backsheet, a substantially transparent front plate, a plurality of PV cells, a plurality of conductive spacers, and a power conversion device. The PV cells can be disposed between the conductive backsheet and the front plate and can be arranged in a plurality of rows. The PV cells within each row can be connected to each other in parallel and the rows can be connected in series. The PV cells can be interconnected between the conductive spacers. The power conversion device can be redundantly connected to the PV cells via a last conductive spacer connected to a last row. The power conversion device can substantially maintain a maximum peak power of the PV module and can convert a lower voltage collectively generated by the PV cells to a predetermined stepped up voltage greater than or equal to 12 volts.

15 Claims, 17 Drawing Sheets

Related U.S. Application Data

(60) Provisional application No. 61/022,232, filed on Jan. 18, 2008, provisional application No. 61/022,264, filed on Jan. 18, 2008, provisional application No. 61/022,253, filed on Jan. 18, 2008, provisional application No. 61/022,267, filed on Jan. 18, 2008, provisional application No. 61/022,228, filed on Jan. 18, 2008, provisional application No. 61/022,234, filed on Jan. 18, 2008, provisional application No. 61/022,236, filed on Jan. 18, 2008, provisional application No. 61/022,240, filed on Jan. 18, 2008, provisional application No. 61/022,242, filed on Jan. 18, 2008, provisional application No. 61/022,277, filed on Jan. 18, 2008, provisional application No. 61/022,278, filed on Jan. 18, 2008, provisional application No. 61/025,570, filed on Feb. 1, 2008, provisional application No. 61/022,245, filed on Jan. 18, 2008, provisional application No. 61/025,575, filed on Feb. 1, 2008, provisional application No. 61/022,246, filed on Jan. 18, 2008, provisional application No. 61/022,258, filed on Jan. 18, 2008, provisional application No. 61/022,263, filed on Jan. 18, 2008, provisional application No. 61/022,249, filed on Jan. 18, 2008, provisional application No. 61/022,280, filed on Jan. 18, 2008, provisional application No. 61/022,252, filed on Jan. 18, 2008, provisional application No. 61/025,578, filed on Feb. 1, 2008, provisional application No. 61/025,581, filed on Feb. 1, 2008, provisional application No. 61/058,485, filed on Jun. 3, 2008, provisional application No. 61/080,628, filed on Jul. 14, 2008, provisional application No. 61/091,642, filed on Aug. 25, 2008, provisional application No. 61/033,200, filed on Mar. 3, 2008.

(51) Int. Cl.
  *H02S 50/15* (2014.01)
  *H01L 31/02* (2006.01)
  *H02M 7/00* (2006.01)

(52) U.S. Cl.
  CPC ............ *H02M 7/003* (2013.01); *H02S 50/15* (2014.12); *Y02E 10/56* (2013.01)

(56) References Cited

U.S. PATENT DOCUMENTS

| | | |
|---|---|---|
| 3,350,234 A | 10/1967 | Ule |
| 3,419,434 A | 12/1968 | Colehower |
| 3,582,777 A * | 6/1971 | Wunderman ......... G01J 1/1626 324/105 |
| 3,833,426 A | 9/1974 | Mesch |
| 4,002,160 A | 1/1977 | Mather |
| 4,020,827 A | 5/1977 | Broberg |
| 4,033,327 A | 7/1977 | Pei |
| 4,120,282 A | 10/1978 | Espy |
| 4,154,998 A | 5/1979 | Luft et al. |
| 4,158,768 A | 6/1979 | Lavelli |
| 4,212,293 A | 7/1980 | Nugent |
| 4,227,298 A | 10/1980 | Keeling |
| 4,309,334 A | 1/1982 | Valitsky |
| 4,316,448 A | 2/1982 | Dodge |
| 4,321,416 A | 3/1982 | Tennant |
| 4,369,498 A | 1/1983 | Schulte |
| 4,410,757 A | 10/1983 | Stamminger et al. |
| 4,461,922 A | 7/1984 | Gay et al. |
| 4,481,378 A | 11/1984 | Lesk |
| 4,514,579 A | 4/1985 | Hanak |
| 4,604,494 A | 8/1986 | Shepard, Jr. |
| 4,611,090 A | 9/1986 | Catella |
| 4,617,421 A | 10/1986 | Nath |
| 4,695,788 A | 9/1987 | Marshall |
| 4,716,258 A | 12/1987 | Murtha |
| 4,747,699 A | 5/1988 | Kobayashi et al. |
| 4,755,921 A | 7/1988 | Nelson |
| 4,773,944 A | 9/1988 | Nath |
| 4,854,974 A * | 8/1989 | Carlson ............... H01L 31/046 136/244 |
| 4,933,022 A | 6/1990 | Swanson |
| 4,964,713 A | 10/1990 | Goetzberger |
| 4,966,631 A | 10/1990 | Matlin |
| 5,013,141 A | 5/1991 | Sakata |
| 5,021,099 A | 6/1991 | Kim |
| 5,048,194 A | 9/1991 | McMurtry |
| 5,096,505 A | 3/1992 | Fraas et al. |
| 5,205,739 A | 4/1993 | Malo |
| 5,246,782 A | 9/1993 | Kennedy |
| 5,268,037 A | 12/1993 | Glatfelter |
| 5,270,636 A | 12/1993 | Lafferty |
| 5,288,337 A | 2/1994 | Mitchell |
| 5,344,497 A | 9/1994 | Fraas |
| 5,374,317 A | 12/1994 | Lamb |
| 5,457,057 A | 10/1995 | Nath |
| 5,468,988 A | 11/1995 | Glatfelter |
| 5,478,402 A | 12/1995 | Hanoka |
| 5,491,040 A | 2/1996 | Chaloner-Gill |
| 5,493,096 A | 2/1996 | Koh |
| 5,505,789 A | 4/1996 | Fraas |
| 5,513,075 A | 4/1996 | Capper |
| 5,538,563 A | 7/1996 | Finkl |
| 5,571,338 A | 11/1996 | Kadonome |
| 5,593,901 A | 1/1997 | Oswald |
| 5,719,758 A | 2/1998 | Nakata |
| 5,735,966 A | 4/1998 | Luch |
| 5,745,355 A | 4/1998 | Tracy et al. |
| 5,801,519 A | 9/1998 | Midya |
| 5,896,281 A | 4/1999 | Bingley |
| 5,910,738 A | 6/1999 | Shinohe |
| 5,982,157 A | 11/1999 | Wattenhofer |
| 5,990,413 A | 11/1999 | Ortabasi |
| 5,994,641 A | 11/1999 | Kardauskas |
| 6,011,215 A | 1/2000 | Glatfelter |
| 6,017,002 A | 1/2000 | Burke et al. |
| 6,043,425 A | 3/2000 | Assad |
| 6,077,722 A | 6/2000 | Jansen |
| 6,111,189 A | 8/2000 | Garvison |
| 6,111,454 A | 8/2000 | Shinohe |
| 6,111,767 A | 8/2000 | Handleman |
| 6,134,784 A | 10/2000 | Carrie |
| 6,177,627 B1 | 1/2001 | Murphy |
| 6,188,012 B1 | 2/2001 | Ralph |
| 6,201,180 B1 | 3/2001 | Meyer |
| 6,281,485 B1 | 8/2001 | Siri |
| 6,288,325 B1 | 9/2001 | Jansen |
| 6,294,723 B2 | 9/2001 | Uematsu |
| 6,331,208 B1 | 12/2001 | Nishida |
| 6,337,436 B1 | 1/2002 | Ganz |
| 6,339,538 B1 | 1/2002 | Handleman |
| 6,351,130 B1 | 2/2002 | Preiser et al. |
| 6,462,265 B1 | 10/2002 | Sasaoka et al. |
| 6,465,724 B1 | 10/2002 | Garvison |
| 6,479,744 B1 | 11/2002 | Tsuzuki et al. |
| 6,515,215 B1 | 2/2003 | Mimura |
| 6,528,716 B2 | 3/2003 | Collette |
| 6,706,963 B2 | 3/2004 | Gaudiana |
| 6,739,692 B2 | 5/2004 | Unosawa |
| 6,750,391 B2 | 6/2004 | Bower |
| 6,753,692 B2 | 6/2004 | Toyomura |
| 6,803,513 B2 | 10/2004 | Beernink |
| 6,858,461 B2 | 2/2005 | Oswald |
| 6,870,087 B1 | 3/2005 | Gallagher |
| 6,882,063 B2 | 4/2005 | Droppo |
| 6,903,261 B2 | 6/2005 | Habraken |
| 6,966,184 B2 | 11/2005 | Toyomura |
| 6,992,256 B1 | 1/2006 | Wiley |
| 7,009,412 B2 | 3/2006 | Chong |
| 7,094,441 B2 | 8/2006 | Chittibabu |
| 7,099,169 B2 | 8/2006 | West et al. |

(56) References Cited

U.S. PATENT DOCUMENTS

| | | |
|---|---|---|
| 7,138,730 B2 | 11/2006 | Lai |
| 7,205,626 B1 | 4/2007 | Nakata |
| 7,259,322 B2 | 8/2007 | Gronet |
| 7,276,724 B2 | 10/2007 | Sheats |
| 7,297,865 B2 | 11/2007 | Terao |
| 7,301,095 B2 | 11/2007 | Murphy |
| 7,336,004 B2 | 2/2008 | Lai |
| 7,339,108 B2 | 3/2008 | Tur |
| 7,342,171 B2 | 3/2008 | Khouri |
| 7,388,146 B2 | 6/2008 | Fraas |
| 7,432,438 B2 | 10/2008 | Rubin et al. |
| 7,498,508 B2 | 3/2009 | Rubin et al. |
| 7,997,938 B2 | 8/2011 | Costello et al. |
| 8,013,239 B2 | 9/2011 | Rubin et al. |
| 8,138,631 B2 | 3/2012 | Allen et al. |
| 8,212,139 B2 | 7/2012 | Meyer |
| 8,563,847 B2 | 10/2013 | Meyer |
| 8,748,727 B2 | 6/2014 | Meyer |
| 8,828,778 B2 | 9/2014 | Meyer |
| 8,829,330 B2 | 9/2014 | Meyer |
| 8,933,320 B2 | 1/2015 | Meyer |
| 2001/0008144 A1 | 7/2001 | Uematsu |
| 2002/0179140 A1 | 12/2002 | Toyomura |
| 2003/0047208 A1 | 3/2003 | Glenn et al. |
| 2003/0121228 A1 | 7/2003 | Stoehr |
| 2003/0121542 A1 | 7/2003 | Harneit et al. |
| 2003/0201007 A1 | 10/2003 | Fraas |
| 2004/0016454 A1 | 1/2004 | Murphy et al. |
| 2004/0055594 A1 | 3/2004 | Hochberg |
| 2004/0089337 A1 | 5/2004 | Chou |
| 2004/0261834 A1 | 12/2004 | Basore |
| 2004/0261955 A1 | 12/2004 | Shingleton et al. |
| 2005/0000562 A1 | 1/2005 | Kataoka et al. |
| 2005/0022857 A1 | 2/2005 | Daroczi |
| 2005/0034751 A1 | 2/2005 | Gross |
| 2005/0052172 A1* | 3/2005 | Schripsema ............... G05F 1/67 323/284 |
| 2005/0061360 A1 | 3/2005 | Horioka et al. |
| 2005/0081909 A1 | 4/2005 | Paull |
| 2005/0115176 A1 | 6/2005 | Russell |
| 2005/0121067 A1 | 6/2005 | Toyomura et al. |
| 2005/0133081 A1 | 6/2005 | Amato |
| 2005/0158891 A1 | 7/2005 | Barth |
| 2005/0172995 A1 | 8/2005 | Rohrig |
| 2005/0194939 A1 | 9/2005 | Duff, Jr. |
| 2005/0263179 A1 | 12/2005 | Gaudiana |
| 2005/0268959 A1 | 12/2005 | Aschenbrenner |
| 2005/0278076 A1 | 12/2005 | Barbir |
| 2006/0001406 A1 | 1/2006 | Matan |
| 2006/0042681 A1 | 3/2006 | Korman |
| 2006/0054212 A1 | 3/2006 | Fraas |
| 2006/0086384 A1 | 4/2006 | Nakata |
| 2006/0092588 A1 | 5/2006 | Realmuto et al. |
| 2006/0162772 A1 | 7/2006 | Presher, Jr. |
| 2006/0174931 A1 | 8/2006 | Mapes et al. |
| 2006/0174939 A1 | 8/2006 | Matan |
| 2006/0180197 A1 | 8/2006 | Gui |
| 2006/0185716 A1 | 8/2006 | Murozono |
| 2006/0185727 A1 | 8/2006 | Matan |
| 2006/0213548 A1 | 9/2006 | Bachrach |
| 2006/0225777 A1 | 10/2006 | Buechel |
| 2006/0235717 A1 | 10/2006 | Sharma |
| 2006/0261830 A1 | 11/2006 | Taylor |
| 2006/0266407 A1 | 11/2006 | Lichey |
| 2006/0290344 A1* | 12/2006 | Shimotomai ............... G01J 1/08 324/750.02 |
| 2007/0035864 A1 | 2/2007 | Vasylyev |
| 2007/0056626 A1 | 3/2007 | Funcell |
| 2007/0068567 A1 | 3/2007 | Rubin et al. |
| 2007/0079861 A1 | 4/2007 | Morali |
| 2007/0095384 A1 | 5/2007 | Farquhar |
| 2007/0103108 A1 | 5/2007 | Capp |
| 2007/0113885 A1 | 5/2007 | Chan |
| 2007/0124619 A1 | 5/2007 | Mizukami |
| 2007/0125415 A1 | 6/2007 | Sachs |
| 2007/0144577 A1 | 6/2007 | Rubin et al. |
| 2007/0151594 A1 | 7/2007 | Mascolo et al. |
| 2007/0157964 A1 | 7/2007 | Gronet |
| 2007/0179720 A1 | 8/2007 | Becker et al. |
| 2007/0186971 A1 | 8/2007 | Lochun |
| 2007/0193620 A1 | 8/2007 | Hines |
| 2007/0199588 A1 | 8/2007 | Rubin et al. |
| 2007/0215195 A1 | 9/2007 | Buller |
| 2007/0235077 A1 | 10/2007 | Nagata |
| 2007/0240755 A1 | 10/2007 | Lichy |
| 2007/0251569 A1 | 11/2007 | Shan |
| 2007/0261731 A1 | 11/2007 | Abe |
| 2007/0266672 A1 | 11/2007 | Bateman |
| 2007/0272295 A1 | 11/2007 | Rubin et al. |
| 2007/0273338 A1 | 11/2007 | West |
| 2007/0295381 A1 | 12/2007 | Fujii |
| 2008/0000516 A1 | 1/2008 | Shifman |
| 2008/0029149 A1 | 2/2008 | Simon |
| 2008/0029152 A1 | 2/2008 | Milshtein |
| 2008/0037141 A1 | 2/2008 | Tom |
| 2008/0047603 A1 | 2/2008 | Wong et al. |
| 2008/0092944 A1 | 4/2008 | Rubin et al. |
| 2008/0122518 A1 | 5/2008 | Besser et al. |
| 2008/0142071 A1 | 6/2008 | Dorn et al. |
| 2008/0163922 A1 | 7/2008 | Horne et al. |
| 2008/0164766 A1 | 7/2008 | Adest et al. |
| 2008/0210286 A1 | 9/2008 | Ball |
| 2008/0236648 A1 | 10/2008 | Klein et al. |
| 2008/0290368 A1 | 11/2008 | Rubin |
| 2008/0298051 A1 | 12/2008 | Chu |
| 2009/0025778 A1 | 1/2009 | Rubin et al. |
| 2009/0121968 A1 | 5/2009 | Okamoto |
| 2009/0151775 A1 | 6/2009 | Pietrzak |
| 2009/0183760 A1 | 7/2009 | Meyer |
| 2009/0183763 A1 | 7/2009 | Meyer |
| 2009/0183764 A1 | 7/2009 | Meyer |
| 2009/0206287 A1* | 8/2009 | Trupke ............... G01N 21/6489 250/582 |
| 2009/0217965 A1 | 9/2009 | Dougal et al. |
| 2009/0242021 A1 | 10/2009 | Petkie et al. |
| 2009/0250093 A1 | 10/2009 | Chen |
| 2010/0000165 A1 | 1/2010 | Koller |
| 2010/0014738 A1 | 1/2010 | Birnholz et al. |
| 2010/0089390 A1 | 4/2010 | Miros et al. |
| 2010/0131108 A1 | 5/2010 | Meyer |
| 2010/0175337 A1 | 7/2010 | Mascolo et al. |
| 2010/0212720 A1 | 8/2010 | Meyer et al. |
| 2010/0219688 A1 | 9/2010 | Shyu et al. |
| 2010/0253151 A1 | 10/2010 | Gerhardinger et al. |
| 2010/0282293 A1 | 11/2010 | Meyer et al. |
| 2010/0313499 A1 | 12/2010 | Gangemi |
| 2010/0313933 A1 | 12/2010 | Xu |
| 2011/0018353 A1 | 1/2011 | Yu |
| 2011/0039992 A1 | 2/2011 | Irie |
| 2011/0067748 A1 | 3/2011 | Pfeiffer |
| 2011/0241431 A1 | 10/2011 | Chen et al. |
| 2011/0301772 A1 | 12/2011 | Zuercher et al. |
| 2012/0042588 A1 | 2/2012 | Erickson, Jr. |
| 2012/0204935 A1 | 8/2012 | Meyer et al. |
| 2012/0234374 A1 | 9/2012 | Meyer |
| 2012/0319494 A1 | 12/2012 | Ecrabey et al. |
| 2013/0062956 A1 | 3/2013 | Meyer |
| 2013/0312812 A1 | 11/2013 | Meyer |
| 2014/0035373 A1 | 2/2014 | Meyer |
| 2014/0174535 A1 | 6/2014 | Meyer |
| 2014/0360561 A1 | 12/2014 | Meyer |

FOREIGN PATENT DOCUMENTS

| | | |
|---|---|---|
| CN | 1628390 | 6/2005 |
| CN | 101336476 | 12/2008 |
| DE | 3708548 | 9/1988 |
| DE | 4027325 | 4/1992 |
| DE | 20314372 | 12/2003 |
| DE | 102004001248 | 1/2005 |
| DE | 202006020180 | 12/2007 |
| EP | 1724842 | 11/2006 |
| EP | 1744372 | 1/2007 |
| EP | 2172980 | 4/2010 |

(56) References Cited

FOREIGN PATENT DOCUMENTS

| EP | 2251941 | 11/2010 |
|---|---|---|
| GB | 2331530 | 5/1999 |
| JP | 60-141152 | 9/1985 |
| JP | 02-025079 | 1/1990 |
| JP | 09-045946 | 2/1997 |
| JP | 10-69321 | 3/1998 |
| JP | 10-245935 | 9/1998 |
| JP | 10-281562 | 10/1998 |
| JP | 11-041832 | 2/1999 |
| JP | 11-103538 | 4/1999 |
| JP | 2000-114571 | 4/2000 |
| JP | 2000-213255 | 8/2000 |
| JP | 2000-357812 | 12/2000 |
| JP | 2001-268891 | 9/2001 |
| JP | 2002-073184 | 3/2002 |
| JP | 2002-305318 | 10/2002 |
| JP | 2002-314112 | 10/2002 |
| JP | 2003-026455 | 1/2003 |
| JP | 2003-282918 | 10/2003 |
| JP | 2006-040931 | 2/2006 |
| JP | 2006-302147 | 11/2006 |
| JP | 2007-234795 | 9/2007 |
| JP | 2007-294630 | 11/2007 |
| JP | 2009-503870 | 1/2009 |
| JP | 2009-032945 | 2/2009 |
| JP | 2009-545877 | 12/2009 |
| JP | 2011-2991 | 1/2011 |
| JP | 2011-129626 | 6/2011 |
| KR | 10-1998-0087002 | 12/1998 |
| KR | 10-2007-0104300 | 10/2007 |
| KR | 10-2007-0107318 | 11/2007 |
| KR | 10-2010-0129721 | 12/2010 |
| TW | 201042770 | 12/2010 |
| TW | 201106490 | 12/2011 |
| WO | WO 02/35613 | 2/2002 |
| WO | WO 2004/021455 | 3/2004 |
| WO | WO 2007/071064 | 6/2007 |
| WO | WO 2007/095757 | 8/2007 |
| WO | WO 2007/137407 | 12/2007 |
| WO | WO 2008/016453 | 2/2008 |
| WO | WO 2008/028677 | 3/2008 |
| WO | WO 2008/042828 | 4/2008 |
| WO | WO 2008/046201 | 4/2008 |
| WO | WO 2008/141415 | 11/2008 |
| WO | WO 2009/012567 | 1/2009 |
| WO | WO 2009/076740 | 6/2009 |
| WO | WO 2009/092110 | 7/2009 |
| WO | WO 2009/092111 | 7/2009 |
| WO | WO 2010/012062 | 2/2010 |
| WO | WO 2010/037393 | 4/2010 |
| WO | WO 2010/068226 | 6/2010 |
| WO | WO 2010/096833 | 8/2010 |
| WO | WO 2010/148009 | 12/2010 |
| WO | WO 2011/011855 | 2/2011 |
| WO | WO 2011/109741 | 9/2011 |

OTHER PUBLICATIONS

Chinese Office Action in Chinese Application No. 201180048973.7, dated Jan. 30, 2015, 10 pgs.
Japanese Office Action in Japanese Application No. 2014-540038, dated Mar. 17, 2015, 11 pgs.
Chinese Office Action in Chinese Application No. 201080017252.5, dated May 26, 2015, 7 pgs.
Chinese Office Action in Chinese Application No. 201180048973.7, dated Aug. 12, 2015, 8 pgs.
European Office Action in European Application No. 15158419.0, dated Jun. 9, 2015, 7 pgs.
Korean Office Action in Korean Application No. 10-2014-7014579, dated Jun. 19, 2015, 13 pgs.
Chen, Yaow-Ming, Multiinput Converter With Power Factor Correction, Maximum Power Point Tracking, and Ripple-Free Input Currents, IEEE Transactions on Power Electronics, vol. 19, No. 3, May 204, pp. 631-639.
Sefa, Ibrahim et al., Experimental Study of Interleaved MPPT Converter for PV Systems, IECON 2009, 35th Annual Conference of IEEE Industrial Electronics, Nov. 3-5, 2009, pp. 456-461.
US Office Action in U.S. Appl. No. 12/711,040, dated Jun. 18, 2015, 37 pgs.
US Restriction Requirement in U.S. Appl. No. 13/664,885, dated Jul. 10, 2015, 5 pgs.
US Restriction Requirement in U.S. Appl. No. 13/957,227, dated Jun. 3, 2015, 7 pgs.
European Office Action in European Application No. 12846494.8, dated Oct. 16, 2015, 4 pgs.
Japanese Office Action in Japanese Application No. 2014-540038, dated Aug. 18, 2015, 19 pgs.
Japanese Office Action in Japanese Application No. 2015-026500, dated Oct. 20, 2015, 12 pgs.
US Office Action in U.S. Appl. No. 12/711,040, dated Sep. 25, 2015, 37 pgs.
US Office Action in U.S. Appl. No. 13/957,227, dated Sep. 11, 2015, 20 pgs.
US Restriction Requirement in U.S. Appl. No. 14/053,482, dated Oct. 27, 2015, 20 pgs.
Chinese Office Action in Chinese Application No. 200980109824.X, dated Aug. 24, 2011, 10 pgs.
Chinese Office Action in Chinese Application No. 201080017252.5, dated Aug. 13, 2013, 19 pgs.
Chinese Office Action in Chinese Application No. 201080017252.5, dated Apr. 28, 2014, 12 pgs.
Chinese Office Action in Chinese Application No. 201080017252.5, dated Nov. 14, 2014, 10 pgs.
Chinese Office Action in Chinese Application No. 201080036349.0, dated Jan. 6, 2014, 15 pgs.
Chinese Office Action in Chinese Application No. 201080036349.0, dated Jun. 6, 2014, 9 pgs.
European Search Report in European Application No. 09702762.7, dated Jun. 13, 2013, 2 pgs.
European Search Report in European Application No. 10744485.3, dated Jan. 17, 2014, 4 pgs.
European Search Report in European Application No. 10790069.8, dated May 2, 2013, 10 pgs.
European Office Action in European Application No. 10790069.8, dated Sep. 9, 2014, 5 pgs.
European Search Report in European Application No. 12846494.8, dated Dec. 18, 2014, 7 pgs.
Japanese Office Action in Japanese Application No. 2011-551303, dated Feb. 19, 2013, 3 pgs.
Japanese Office Action in Japanese Application No. 2012-516209, dated Apr. 30, 2013, 3 pgs.
Japanese Office Action in Japanese Application No. 2012-516209, dated Dec. 17, 2013, 5 pgs.
Japanese Office Action in Japanese Application No. 2012-516209, dated Jun. 24, 2014, 12 pgs.
Japanese Office Action in Japanese Application No. 2012-516209, dated Oct. 28, 2014, 8 pgs.
International Search Report and Written Opinion, as issued in connection with International Patent Application No. PCT/US2009/031594, mailed Jun. 25, 2009, 7 pgs.
International Search Report and Written Opinion, as issued in connection with International Patent Application No. PCT/US2009/031596, mailed Sep. 8, 2009, 8 pgs.
International Search Report and Written Opinion, as issued in connection with International Patent Application No. PCT/US2009/031597, mailed Sep. 29, 2009, 7 pgs.
International Search Report and Written Opinion, as issued in connection with International Patent Application No. PCT/US2010/025108, mailed Sep. 27, 2010, 9 pgs.
International Search Report and Written Opinion, as issued in connection with International Patent Application No. PCT/US2010/038702, mailed Jan. 5, 2011, 7 pgs.
International Preliminary Report, as issued in connection with International Patent Application No. PCT/US2010/038702, mailed Dec. 29, 2011, 2 pgs.

(56) References Cited

OTHER PUBLICATIONS

International Search Report and Written Opinion, as issued in connection with International Patent Application No. PCT/US2010/061864, mailed Aug. 31, 2011, 7 pgs.
International Search Report and Written Opinion, as issued in connection with International Patent Application No. PCT/US2011/047291, mailed Mar. 19, 2012, 9 pgs.
International Search Report and Written Opinion, as issued in connection with International Patent Application No. PCT/US2012/062784, mailed Mar. 19, 2013, 13 pgs.
International Search Report and Written Opinion, as issued in connection with International Patent Application No. PCT/US2013/062747, mailed Jan. 28, 2014, 14 pgs.
International Search Report and Written Opinion, as issued in connection with International Patent Application No. PCT/US2014/052166, mailed Nov. 26, 2014, 12 pgs.
Solatron Techonologies, Wiring Solar Modules and Batteries, <http://web.archive.org/web/20030206212224/http://partsonsale.com/learnwiring.htm>, web archived May 9, 2008, 6 pgs.
Zeghbroeck, Bart V., Ellipsometer Data Table, http://ece-www.colorado.edu/~bart/book/ellipstb.htm, 1997, 2 pgs.
US Restriction Requirement in U.S. Appl. No. 12/357,268, dated Nov. 29, 2011, 9 pgs.
US Restriction Requirement in U.S. Appl. No. 12/357,268, dated Feb. 3, 2012, 7 pgs.
US Office Action in U.S. Appl. No. 12/357,268, dated Aug. 2, 2012, 27 pgs.
US Office Action in U.S. Appl. No. 12/357,268, dated Nov. 21, 2012, 22 pgs.
US Notice of Allowance in U.S. Appl. No. 12/357,268, dated Mar. 11, 2014, 12 pgs.
US Restriction Requirement in U.S. Appl. No. 12/684,595, dated Jan. 9, 2012, 11 pgs.
US Notice of Allowance in U.S. Appl. No. 12/684,595, dated Mar. 16, 2012, 12 pgs.
US Restriction Requirement in U.S. Appl. No. 13/485,210, dated Jan. 15, 2014, 5 pgs.
US Notice of Allowance in U.S. Appl. No. 13/485,210, dated May 29, 2014, 13 pgs.
US Restriction Requirement in U.S. Appl. No. 12/357,260, dated Aug. 2, 2012, 5 pgs.
US Office Action in U.S. Appl. No. 12/357,260, dated Feb. 5, 2013, 17 pgs.
US Office Action in U.S. Appl. No. 12/357,260, dated May 23, 2013, 23 pgs.
US Office Action in U.S. Appl. No. 12/357,260, dated Apr. 22, 2014, 26 pgs.
US Notice of Allowance in U.S. Appl. No. 12/357,260, dated Sep. 4, 2014, 8 pgs.
US Restriction Requirement in U.S. Appl. No. 12/357,277, dated Nov. 10, 2011, 7 pgs.
US Office Action in U.S. Appl. No. 12/357,277, dated Jan. 26, 2012, 11 pgs.
US Office Action in U.S. Appl. No. 12/357,277, dated Jul. 19, 2012, 12 pgs.
US Restriction Requirement in U.S. Appl. No. 12/711,040, dated Jun. 18, 2012, 7 pgs.
US Office Action in U.S. Appl. No. 12/711,040, dated Nov. 26, 2012, 29 pgs.
US Office Action in U.S. Appl. No. 12/711,040, dated Jul. 5, 2013, 35 pgs.
US Restriction Requirement in U.S. Appl. No. 12/815,913, dated May 29, 2012, 6 pgs.
US Office Action in U.S. Appl. No. 12/815,913, dated Oct. 5, 2012, 19 pgs.
US Notice of Allowance in U.S. Appl. No. 12/815,913, dated Sep. 3, 2013, 11 pgs.
US Restriction Requirement in U.S. Appl. No. 13/207,164, dated Sep. 28, 2012, 7 pgs.
US Office Action in U.S. Appl. No. 13/207,164, dated Feb. 14, 2013, 20 pgs.
US Office Action in U.S. Appl. No. 13/207,164, dated Aug. 29, 2013, 34 pgs.
US Notice of Allowance in U.S. Appl. No. 13/207,164, dated Nov. 27, 2013, 12 pgs.

\* cited by examiner

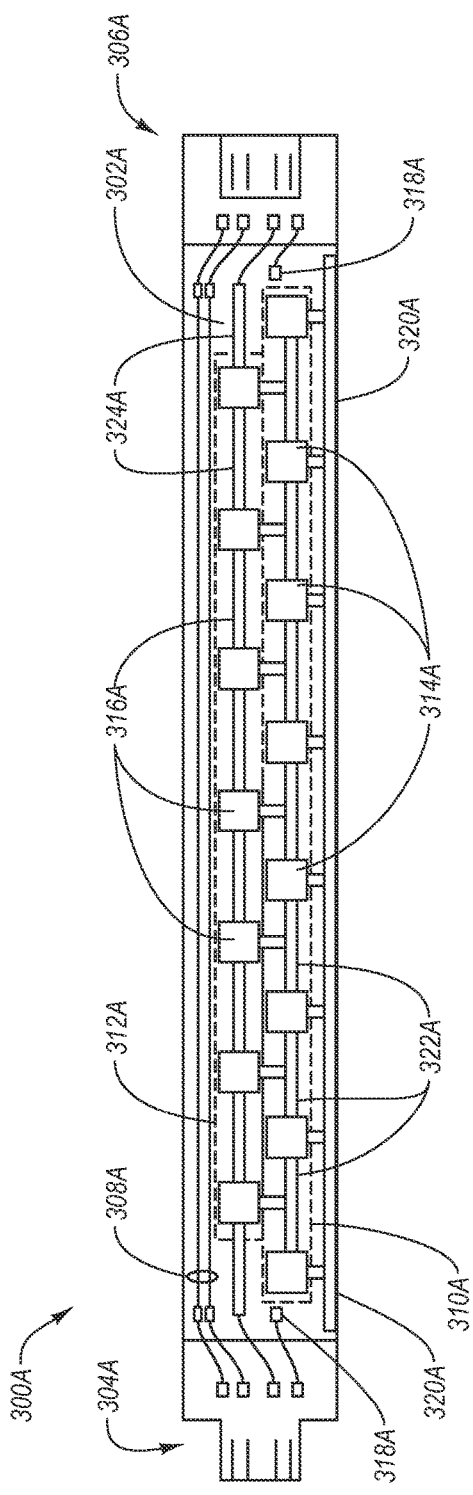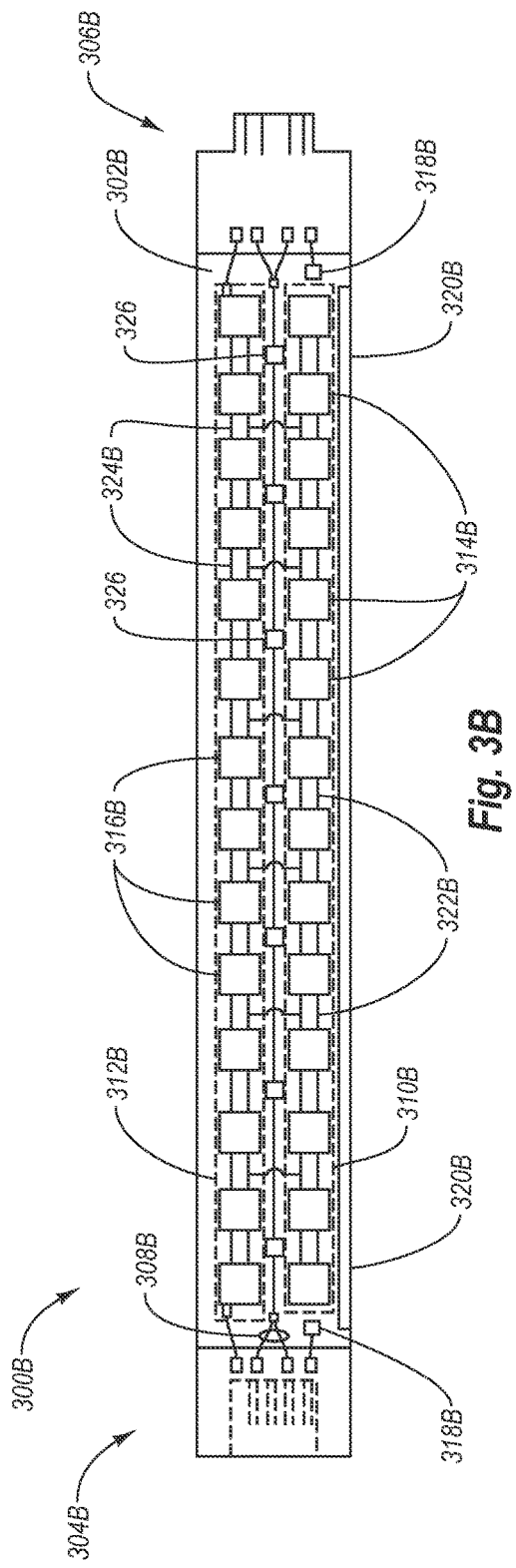
Fig. 3A
Fig. 3B

| Std 2 kW Silicon (10-200W Modules) Reliability Model | Existing Unit Reli | Per Sys | Level Of Redund. | Unit Reli | Overall Comp. Reli | Modes |
|---|---|---|---|---|---|---|
| Silicone Cells And Grid Structures | 99.9990% | 960 | 1 | 0.99999 | 99.0446% | Shunting, EVA fail (thermal), Crack |
| Silicone - Silicon Interconnects (2x) | 99.9950% | 1920 | 1 | 0.99995 | 99.8462% | Delam from wafer, tearing, ...(narrow) |
| Panel Buss Structure | 99.9990% | 40 | 1 | 0.9999 | 99.6008% | Tearing, shorting, corrsion, solder fails, ... |
| Bypass Diodes | 99.9000% | 40 | 2 | 0.999999 | 99.9980% | Degradation, contacts, ... |
| Jbox Failures | 99.9990% | 10 | 1 | 0.9999 | 99.9000% | Wind damage (blown off), moisture pen |
| DC-DC Wire Interconnects | 99.9990% | 20 | 1 | 0.99999 | 99.9800% | Corrosion, Water, Freeze/Crack |
| DC-Inverter Wiring | 100.0000% | 2 | 1 | 1 | 100.0000% | Broken conduit, ... |
| DC to Inverter Interconnects | 99.9990% | 2 | 1 | 0.99999 | 99.9980% | Thermal cycling, loose connections |
| GF Fuse Failures (In Inverter) | 99.0000% | 1 | 1 | 0.99 | 99.0000% | False failures, bad fuse, ... |
| Safety Switch | 99.9000% | 1 | 1 | 0.999 | 99.9000% | Poor contacts, Wear |
| Inverter | 98.0000% | 1 | 1 | 0.98 | 98.0000% | Components, board failures, thermal |
| AC Interconnection / Breaker | 99.9990% | 2 | 1 | 0.99999 | 99.9980% | False failures, more active than breaker |
| TAPE / Glass Delamination | 99.9000% | 10 | 1 | 0.999 | 99.0045% | Loss of small area - catastrophic |
| Moisture Ingress | 99.9900% | 10 | 1 | 0.9999 | 99.9000% | Sealant failuer, jbox failure, iconic shorting |
| Cracked Glass | 99.9000% | 10 | 1 | 0.999 | 99.0045% | Installation, storm damage, frame movement |
| | | | | Cum Reli | 96.80% | 85.89% |

Fig. 12A

REDUNDANT ELECTRICAL ARCHITECTURE FOR PHOTOVOLTAIC MODULES

CROSS-REFERENCE TO RELATED APPLICATIONS

This patent application is a divisional of U.S. patent application Ser. No. 12/357,260, filed Jan. 21, 2009, which:

(i) claims the benefit of and priority to U.S. Provisional Patent Application Ser. No. 61/022,232, filed Jan. 18, 2008 by Dallas W. Meyer for POLISHED AND TEXTURED BACK CONTACTS FOR A THIN-FILM PHOTOVOLTAIC SYSTEM;

(ii) claims the benefit of and priority to U.S. Provisional Patent Application Ser. No. 61/022,264, filed Jan. 18, 2008 by Dallas W. Meyer for A THIN PROTECTIVE FILM FOR PHOTOVOLTAIC SYSTEMS;

(iii) claims the benefit of and priority to U.S. Provisional Patent Application Ser. No. 61/022,253, filed Jan. 18, 2008 by Dallas W. Meyer for A FILM LEVEL ENCAPSULATION PHOTOVOLTAIC SYSTEM;

(iv) claims the benefit of and priority to U.S. Provisional Patent Application Ser. No. 61/022,267, filed Jan. 18, 2008 by Dallas W. Meyer for A PHOTOVOLTAIC SYSTEM WITH EMBEDDED ELECTRONICS;

(v) claims the benefit of and priority to U.S. Provisional Patent Application Ser. No. 61/022,228, filed Jan. 18, 2008 by Dallas W. Meyer for A SINGLE USE DIODE FOR A PHOTOVOLTAIC SYSTEM;

(vi) claims the benefit of and priority to U.S. Provisional Patent Application Ser. No. 61/022,234, filed Jan. 18, 2008 by Dallas W. Meyer for A HIGHLY COMPLIANT INTERCONNECT FOR A PHOTOVOLTAIC SYSTEM;

(vii) claims the benefit of and priority to U.S. Provisional Patent Application Ser. No. 61/022,236, filed Jan. 18, 2008 by Dallas W. Meyer for A FAULT TOLERANT PHOTOVOLTAIC SYSTEM;

(viii) claims the benefit of and priority to U.S. Provisional Patent Application Ser. No. 61/022,240, filed Jan. 18, 2008 by Dallas W. Meyer for INTEGRATED DEFECT MANAGEMENT FOR THIN-FILM PHOTOVOLTAIC SYSTEMS;

(ix) claims the benefit of and priority to U.S. Provisional Patent Application Ser. No. 61/022,242, filed Jan. 18, 2008 by Dallas W. Meyer for OPERATING FEATURES FOR INTEGRATED PHOTOVOLTAIC SYSTEMS;

(x) claims the benefit of and priority to U.S. Provisional Patent Application Ser. No. 61/022,277, filed Jan. 18, 2008 by Dallas W. Meyer for A PHOTOVOLTAIC SYSTEM USING NON-UNIFORM ILLUMINATION;

(xi) claims the benefit of and priority to U.S. Provisional Patent Application Ser. No. 61/022,278, filed Jan. 18, 2008 by Dallas W. Meyer for LOW MAGNIFICATION CONCENTRATED PHOTOVOLTAIC SYSTEM;

(xii) claims the benefit of and priority to U.S. Provisional Patent Application Ser. No. 61/025,570, filed Feb. 1, 2008 by Dallas W. Meyer for A SELF-DE-ICING PHOTOVOLTAIC SYSTEM;

(xiii) claims the benefit of and priority to U.S. Provisional Patent Application Ser. No. 61/022,245, filed Jan. 18, 2008 by Dallas W. Meyer for A VERY HIGH ASPECT RATIO THIN-FILM PHOTOVOLTAIC SYSTEM;

(xiv) claims the benefit of and priority to U.S. Provisional Patent Application Ser. No. 61/025,575, filed Feb. 1, 2008 by Dallas W. Meyer for PRODUCTION TESTING OF LARGE AREA PHOTOVOLTAIC MODULES;

(xv) claims the benefit of and priority to U.S. Provisional Patent Application Ser. No. 61/022,246, filed Jan. 18, 2008 by Dallas W. Meyer for A LONGITUDINALLY CONTINUOUS PHOTOVOLTAIC MODULE;

(xvi) claims the benefit of and priority to U.S. Provisional Patent Application Ser. No. 61/022,258, filed Jan. 18, 2008 by Dallas W. Meyer for A CONTINUOUS LARGE AREA PHOTOVOLTAIC SYSTEM;

(xvii) claims the benefit of and priority to U.S. Provisional Patent Application Ser. No. 61/022,263, filed Jan. 18, 2008 by Dallas W. Meyer for A BACK-ELECTRODE, LARGE AREA CONTINUOUS PHOTOVOLTAIC MODULE;

(xviii) claims the benefit of and priority to U.S. Provisional Patent Application Ser. No. 61/022,249, filed Jan. 18, 2008 by Dallas W. Meyer for CORRUGATED PHOTOVOLTAIC PANELS;

(xix) claims the benefit of and priority to U.S. Provisional Patent Application Ser. No. 61/022,280, filed Jan. 18, 2008 by Dallas W. Meyer for A VERY HIGH EFFICIENCY THIN-FILM PHOTOVOLTAIC SYSTEM;

(xx) claims the benefit of and priority to U.S. Provisional Patent Application Ser. No. 61/022,252, filed Jan. 18, 2008 by Dallas W. Meyer for A MULTI-USE GROUND BASED PHOTOVOLTAIC SYSTEM;

(xxi) claims the benefit of and priority to U.S. Provisional Patent Application Ser. No. 61/025,578, filed Feb. 1, 2008 by Dallas W. Meyer for A PREDICTIVE SYSTEM FOR DISTRIBUTED POWER SOURCE MANAGEMENT;

(xxii) claims the benefit of and priority to U.S. Provisional Patent Application Ser. No. 61/025,581, filed Feb. 1, 2008 by Dallas W. Meyer for A WEATHERPROOF CORRUGATED PHOTOVOLTAIC PANEL SYSTEM;

(xxiii) claims the benefit of and priority to U.S. Provisional Patent Application Ser. No. 61/033,200, filed Mar. 3, 2008 by Dallas W. Meyer for AN ELECTRONICALLY CURRENT BALANCED PHOTOVOLTAIC SYSTEM;

(xxiv) claims the benefit of and priority to U.S. Provisional Patent Application Ser. No. 61/058,485, filed Jun. 3, 2008 by Dallas W. Meyer for A HOME OWNER INSTALLED GROUND OR ROOF MOUNTED SOLAR SYSTEM;

(xxv) claims the benefit of and priority to U.S. Provisional Patent Application Ser. No. 61/080,628, filed Jul. 14, 2008 by Dallas W. Meyer for A LOW COST SOLAR MODULE;

(xxvi) claims the benefit of and priority to U.S. Provisional Patent Application Ser. No. 61/091,642, filed Aug. 25, 2008 by Dallas W. Meyer for A LOW COST, HIGH RELIABILITY SOLAR PANEL;

The twenty-seven (27) above-identified patent applications are hereby incorporated herein by reference in their entirety.

BACKGROUND OF THE INVENTION

1. The Field of the Invention

The present invention relates generally to photovoltaic ("PV") modules. More particularly, embodiments of the invention relate to a redundant electrical architecture including one or more electronic devices for use in PV modules.

2. The Related Technology

There are two main types of solar collectors, including silicon and thin films, commonly used in PV modules, the solar collectors commonly composed of PV cells. Silicon is currently the predominant technology, and can generally be implemented as monocrystalline or polycrystalline cells encapsulated behind a transparent glass front plate. Thin film technology is not as wide-spread as the silicon technology due to its reduced efficiency, but it is gaining in popularity due to its lower cost.

Currently, the solar energy industry is looking for ways to decrease the cost per unit of energy generated by PV modules. One approach to reducing cost per unit energy is to increase the exposure of the PV module to solar energy over time. For example, the orientation of the PV module relative to the sun can be adjusted throughout the day and/or throughout the year. Changing the orientation of the PV module relative to the sun throughout the day and/or year can require adjustable mounting systems that are costly and/or complicated with parts prone to failure over the lifetime of the PV module.

Another approach to reducing the cost per unit energy of a PV module is to reduce the solar collector density of the PV module and concentrate solar energy incident on the PV module on the remaining solar collectors. However, conventional PV modules are typically very sensitive to and perform poorly under non-uniform illumination conditions that can be associated with reflector systems.

Additionally, conventional PV modules sometimes incorporate one or more electronic devices, such as power inverters, with the PV module. Power inverters and other electronic devices incorporated with conventional PV modules are usually sized and shaped such that the electronic device is mounted to the backside of the PV module. As a result, flying leads are required to connect the electronic device to the PV module. The power inverters and other electronic devices can also add significant cost to the PV module and are prone to failure.

Alternately or additionally, the electronic devices employed in conjunction with PV modules can have high power requirements, e.g., on the order of 1000s of watts, with leads carrying up to 600 volts which can represent a significant safety hazard for residential use. Typically, these types of high-power electronic components and devices are in relatively low demand in the world-wide electronics market compared to consumer electronics and are not mass-produced. Instead, these high-power electronic devices may comprise specialized electronic devices sold in low volumes at relatively high costs and low reliability. The high cost of the electronic devices employed with PV modules can represent a significant factor in the total cost of a PV system.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

In generally, example embodiments of the invention relate to PV modules and power conversion devices and active row-balancing devices that can be included in PV modules.

One example embodiment includes a PV module comprising a conductive backsheet, a substantially transparent front plate, a plurality of PV cells, a plurality of conductive spacers, and a power conversion device. The PV cells can be disposed between the conductive backsheet and the front plate and can be arranged in a plurality of rows. The PV cells within each row can be connected to each other in parallel and the rows can be connected in series. The PV cells can be interconnected between the conductive spacers. The power conversion device can be redundantly connected to the PV cells via a last conductive spacer connected to a last row. The power conversion device can substantially maintain a maximum peak power of the PV module and can convert a lower voltage collectively generated by the PV cells to a predetermined stepped up voltage greater than or equal to 12 volts.

Another example embodiment includes a method of calibrating a PV module. The method can include downloading a first set of computer executable instructions onto a PV module. The PV module can comprise a power conversion device that includes a plurality of power conversion circuits. The first set of computer executable instructions can be configured to control operation of the PV module during calibration. The PV module can be exposed to multiple illumination intensities and multiple ambient temperatures. Measurement data can be generated for each illumination intensity and ambient temperature. The measurement data can be representative of one or more of: an electrical resistance of each power conversion circuit, a power output of each power conversion circuit, a peak power current of each power conversion circuit, a peak power voltage of each power conversion circuit, or a local circuit phase of each power conversion circuit. A plurality of calibration curves can be generated from the measurement data. The calibration curves can be stored in a memory of the PV module and can allow a control module of the PV module to transform measurements in the field into physical data. The first set of computer executable instructions can be replaced with a second set of computer executable instructions configured to control operation of the PV module in the field.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 3A-3B disclose aspects of some example power conversion devices that include dual voltage gain stages;

FIGS. 12A-12B disclose a reliability study of a conventional 2 kW PV system versus a 2 kW PV system incorporating redundant electronics according to some embodiments of the invention.

DETAILED DESCRIPTION OF EXAMPLE EMBODIMENTS

Embodiments of the invention are generally directed to a PV module including a plurality of PV cells and a power conversion device redundantly connected to the PV cells. The power conversion device can include a plurality of redundant power conversion circuits that convert a first voltage collectively generated by the PV cells to a higher voltage suitable for transmission. The power conversion circuits can also substantially maintain maximum peak power of the PV cells.

I. Example Operating Environment

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1A:
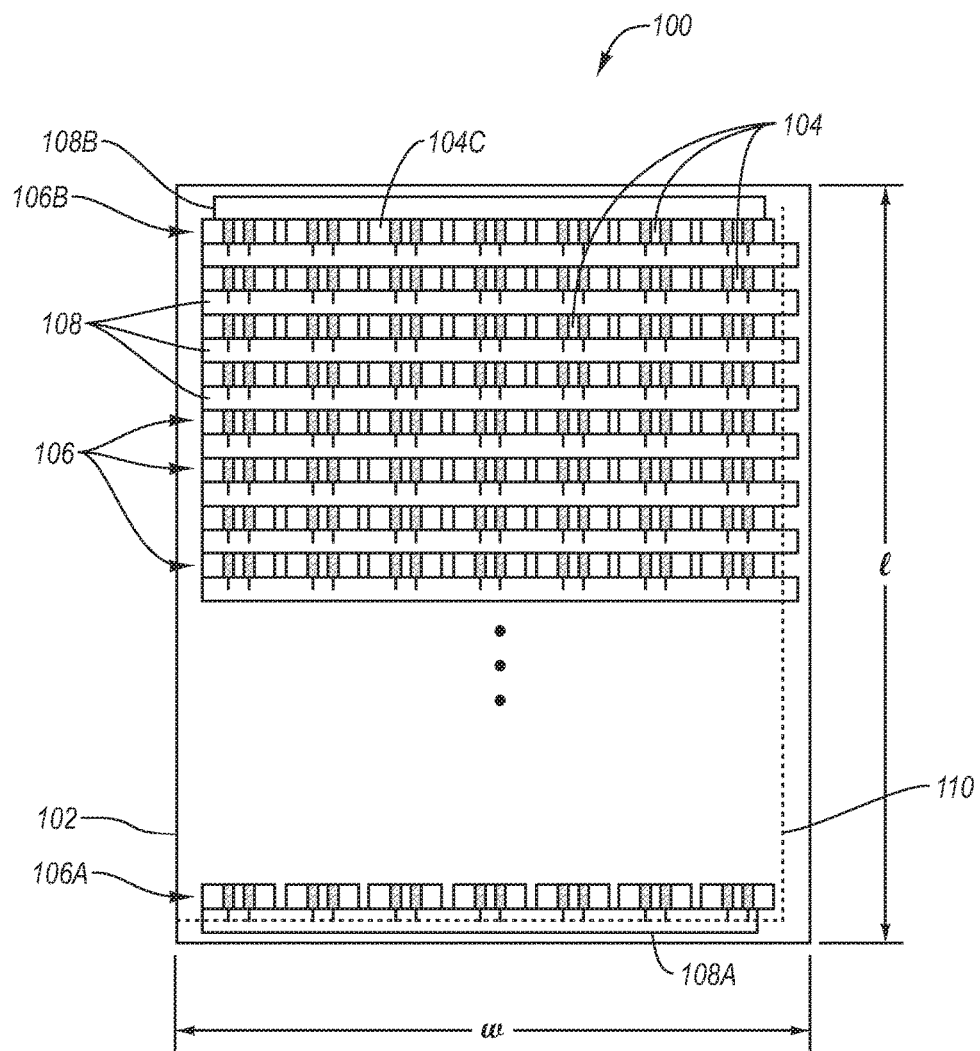
FIGS. 1A-1D disclose aspects of an example PV module that can include a redundantly connected power conversion device.
Figure 1B:
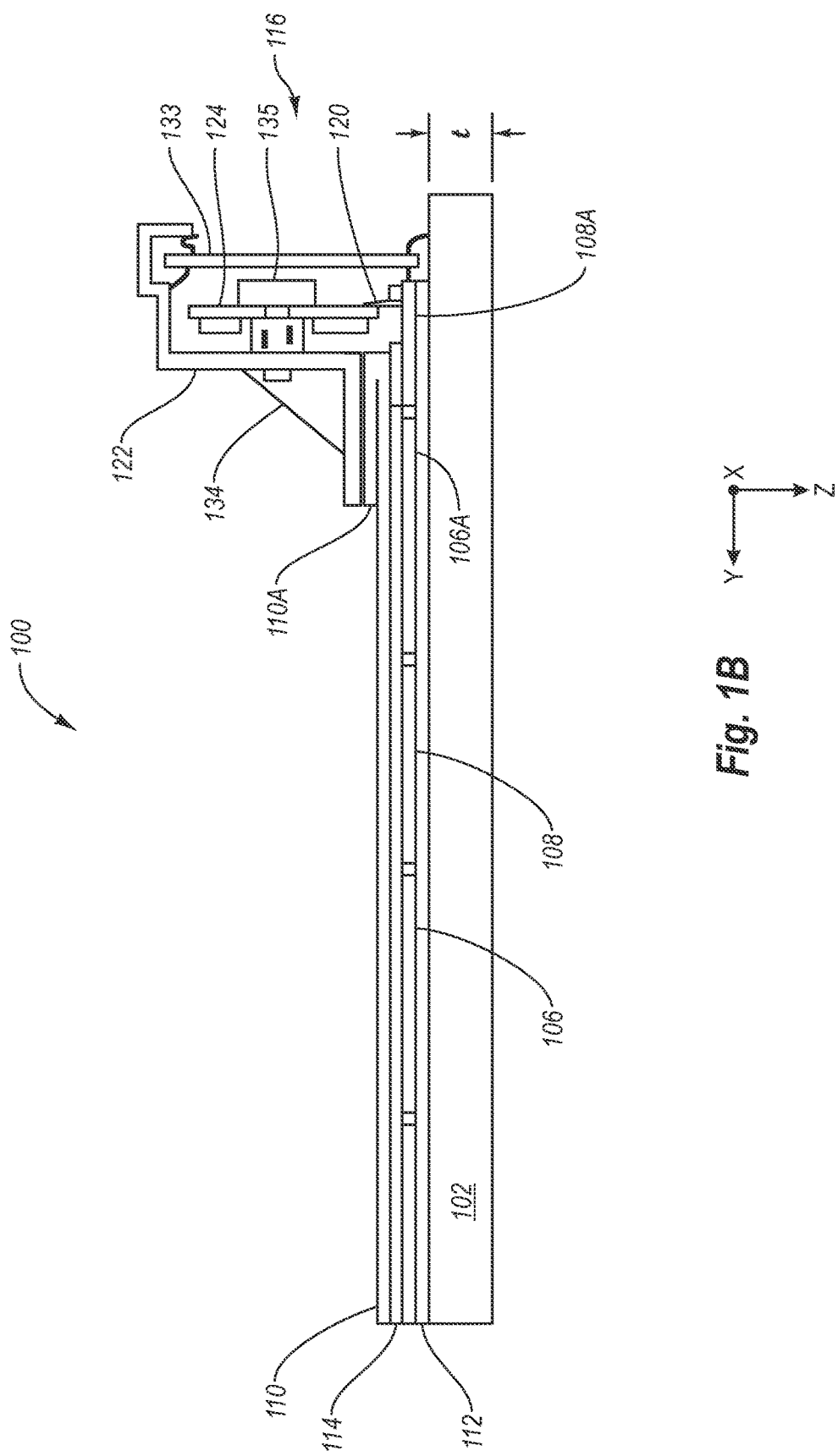
Figure 1C:
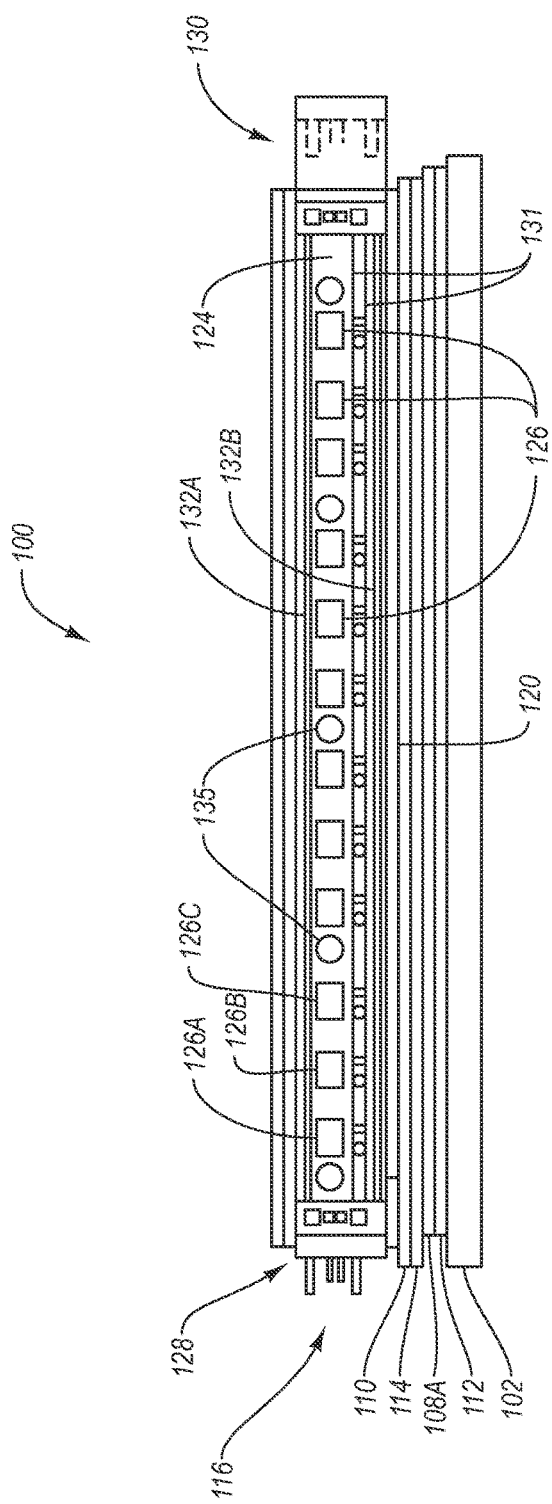

Turning first to FIGS. 1A-1C, one possible environment wherein embodiments of the present invention can be practiced is disclosed. Particularly, FIGS. 1A, 1B and 1C depict, respectively, a front view, a cross-sectional view, and an end view of a photovoltaic module 100 in simplified form. As shown in FIG. 1A, the PV module 100 can comprise a front plate 102, a plurality of PV cells 104 (collectively "PV cell array 104") disposed beneath the front plate 102 that can be arranged in rows 106, a plurality of spacers 108 that the rows 106 can be interconnected between, and a backsheet 110.

With additional reference to FIGS. 1B and 1C, the PV module 100 can further include an adhesive layer 112 coupling the rows 106 of PV cells 104 to the front plate 102, a buffer layer 114 disposed between the rows 106 of PV cells 104 and the backsheet 110, and a power conversion device 116 redundantly connected in series to the rows 106 via a bottom spacer 108A at the bottom of the PV module 100.

The front plate 102 may comprise a substrate that is substantially transparent to solar radiation, such as glass, plastic, or the like, upon which the other layers of the PV module 100 can be grown or otherwise placed during manufacture of the PV module 100. The front plate 102 may protect the PV cells 104 from damage due to environmental factors, including moisture, wind, and the like. The substantially transparent nature of the front plate 102 with respect to solar radiation can allow light rays to penetrate through the front plate 102 and impinge upon the PV cells 104. Alternately or additionally, the front plate 102 can provide structural support to the PV cells 104.

In some embodiments, the front plate 102 can be characterized by a length l (FIG. 1A), a width w (FIG. 1A) and a thickness t (FIG. 1B). The length l, width w and thickness t can be approximately 1830.5 mm, 947 mm, and 3.2 mm, respectively. Alternately or additionally, the length l, width w and thickness t can be more or less than 1830.5 mm, 947 mm, and 3.2 mm, respectively.

The adhesive layer 112 can couple the front plate 102 to the PV cells 104 and may comprise ethylene-vinyl acetate ("EVA"), or other suitable adhesive. In some embodiments, the adhesive layer 112 can be 2-4 mils thick, or more or less than 2-4 mils thick in other embodiments. The adhesive layer 112 may be substantially transparent to solar radiation to allow light rays to reach the PV cells 104. Alternately or additionally, the adhesive layer 112 can be treated to substantially prevent ultraviolet ("UV") damage and/or yellowing of the adhesive layer 112.

The buffer layer 114 can couple the backsheet 110 to the PV cells 104 and can electrically insulate the PV cells 104 from the backsheet 110. As such, the buffer layer 114 can comprise an adhesive such as EVA, an electrically insulating material such as polyethylene terephthalate ("PET"), or the like or any combination thereof. In some embodiments, the buffer layer 114 can be about 3 mils thick, or more or less than 3 mils thick.

Generally speaking, the PV cells 104 convert solar energy into electricity by the photovoltaic effect. In some embodiments, all of the PV cells 104 in a given row 106 can be connected to each other in parallel, while the rows 106 can be connected to each other in series. Each of the PV cells 104 may comprise a monocrystalline solar cell or a polycrystalline solar cell. Alternately or additionally, strips of thin-film deposited PV material, such as CIGS or amorphous silicon, can be implemented to form each row 106 in the PV module 100 in place of individual cells 104. The PV cells 104 or other PV material implemented in PV module 100 can include silicon, copper, indium, gallium, selenide, or the like or any combination thereof.

In some embodiments, there can be fifteen rows 106 and each row 106 can include seven PV cells 104. Alternately or additionally, there can be more or less than fifteen rows 106 or more or less than seven PV cells 104 per row 106. Accordingly, the PV module 100 can include one-hundred and five PV cells 104 in some embodiments, or more or less than one-hundred and five PV cells 104. Further, each of the PV cells 104 can be configured to individually generate a voltage of approximately 0.6 volts and a current that varies with illumination intensity, but that may be anywhere between 2.5-10 amps under 1 sun of illumination. With the PV cells 104 within each row 106 connected in parallel and the rows 106 connected in series, the PV cell array 104 may generate a voltage of about 9 volts and a current that varies with illumination intensity, but that may be anywhere between 25-60 amps under 1 sun of illumination in some embodiments. Alternately or additionally, the PV cell array 104 can generate a voltage between 3-12 volts and a current less than 25 amps or more than 60 amps.

In some embodiments of the invention, the above-described configuration of the PV module 100 can allow the PV module 100 to be implemented without bypass diodes or other protective devices for the PV cells 104 in the case of a blocked row 106 or blocked cell 104. In particular, the maximum voltage across any of the PV cells 104 can be less than 10 volts in some embodiments, such as 9 volts as described above. In this case, if one of the rows 106 is blocked, e.g., due to one or more faulty PV cells 104 in the blocked row or non-uniform illumination across the blocked row, a maximum of 9 volts can be dissipated across the blocked row 106. However, the PV cells 104 implemented in PV module 100 can generally withstand 9 volts being dissipated through the PV cells 104 without being damaged.

In contrast, in conventional PV modules, the PV cells can be serially connected in a string of 20 cells or more. As a result, the maximum voltage across the PV cells in a conventional PV module can reach up to 600 volts, which can be damaging to blocked PV cells. Thus, some conventional PV modules can require bypass diodes and/or other protective devices to allow power to be routed around blocked PV cells so as to avoid damaging the blocked PV cells. Furthermore, failure of the bypass diodes to operate properly may result in a fire due to PV cell failure.

Each of the spacers 108 can comprise an electrically conductive material, such as aluminum, copper, or the like. The spacers 108 can each be approximately 2-8 mils thick, 62.5 mm wide, and 888 mm long in some embodiments, and/or can have different dimensions than those stated. In some examples, the spacers 108 can include the bottom spacer 108A disposed after a last row 106A and/or a top spacer 108B disposed before a first row 106B, the bottom spacer 108A and/or top spacer 108B being shorter in length than the other spacers 108 disposed between bottom spacer 108A and top spacer 108B.

Figure 1D:
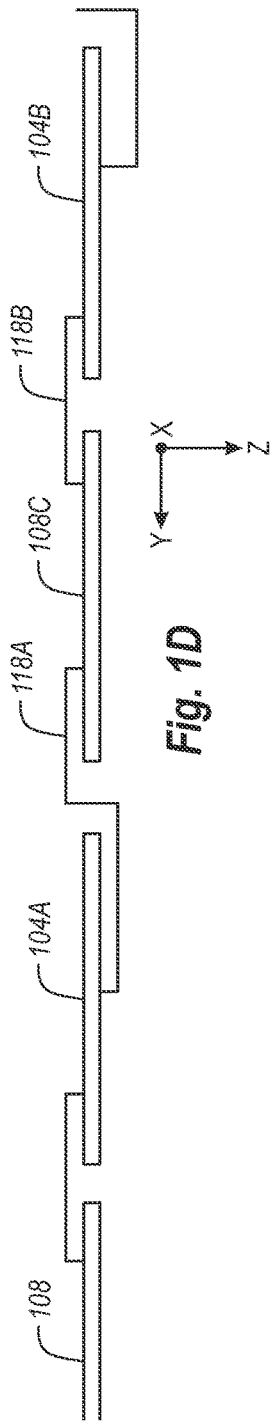

In some embodiments, the spacers 108 can be implemented in the electrical interconnections between adjacent rows 106 of PV cells 104. For example, FIG. 1D depicts a cross-section of two PV cells 104A and 104B from adjacent rows 106 and a spacer 108C interposed in between. As shown, a positive terminal of PV cell 104A can be coupled to the spacer 108C via busbar 118A, while a negative terminal of PV cell 104B can be coupled to the spacer 108C via busbar 118B. All of the PV cells 104 in each row 106 can similarly be coupled to the spacers 108, with the positive terminal of every PV cell 104 in a given row 106 being coupled to one spacer 108 adjacent to the row 106, and the negative terminal of every PV cell 104 in the row 106 being coupled to the other adjacent spacer 108, such that all the PV cells 104 in the row 106 are coupled in parallel to each other via the two spacers 108 on adjacent sides of the row 106. Optionally, the busbars 118A, 118B coupled to each spacer 108 can be arranged such that the busbars 118A, 118B are coupled to a back side of the spacers 108. Alternately or additionally, each of busbars 118A, 118B can comprise double busbars.

As seen in FIG. 1A, at least the bottom spacer 108A can extend beyond the bottom edge of backsheet 110, e.g., in the negative y-direction. In some embodiments, the power conversion device 116 can be redundantly coupled to the rows 106 of PV cells 104 via bottom spacer 108A by being redundantly soldered or otherwise electrically connected to the portion of the bottom spacer 108A extending beyond the bottom edge of backsheet 110. For instance, as shown in FIG. 1B, the power conversion device 116 can be electrically connected to the portion of bottom spacer 108A extending beyond the bottom edge of backsheet 110 using flexible solder ribbon 120 or the like. Additionally, the power conversion device 116 can be grounded to the backsheet 110, with the backsheet 110 electrically connected to the rows 106 of PV cells 104 via top spacer 108B to form a complete circuit.

Alternately or additionally, one or more of the spacers 108 can extend beyond a side edge of the backsheet 110. For example, each of the spacers 108 except for the bottom spacer 108A and the top spacer 108B can extend beyond the side edge of the backsheet 110 in the positive x-direction, as best seen in FIG. 1A. In some embodiments, one or more electronic devices, such as a plurality of bypass diodes and/or an active row-balancing device or the like, can be coupled to the spacers 108 via the portion of each spacer 108 extending beyond the backsheet 110 in the positive x-direction.

As already mentioned above, the backsheet 110 can be implemented as the electrical ground in the PV module 100, forming a current return path for the rows 106 of PV cells 104. More particularly, the backsheet 110 can be coupled to the top row 106B via top spacer 108B. Further, the backsheet 110 can be coupled to the bottom row 106A via power conversion device 116 and bottom spacer 108A to form a current return path for the rows 106 of PV cells 104. As such, in some embodiments, the backsheet 110 can comprise a sheet of conductive material, including one or more of aluminum, copper, sheet metal, stainless steel, or other suitable material(s). Alternately or additionally, the backsheet 110 can be approximately 2-8 mils thick and of sufficient width and length to cover all of PV cells 104. Alternately or additionally, the width and length dimensions of the backsheet 110 can allow at least some portions of one or more of the spacers 108 to extend beyond one or more of the top, bottom, or side edges of the backsheet 110.

As seen in FIG. 1B, the backsheet 110 can include a fold 110A formed at its bottom edge. EVA or other adhesive can be disposed between the fold 110A and the backsheet 110. In some embodiments, the power conversion device 116 can be grounded to the backsheet 110 through a power conversion device 116 housing 122 and the fold 110A of backsheet 110.

Some aspects of the power conversion device 116 are disclosed in FIGS. 1B-1C and FIGS. 2A-2C. As shown in FIGS. 1B-1C, the power conversion device 116 can comprise a housing 122, printed circuit board ("PCB") 124, and one or more power conversion circuits 126 (FIG. 1C). Optionally, the power conversion device 116 can include a first connector 128 and a second connector 130 that is complementary to the first connector 128.

In some embodiments of the invention, the power conversion device 116, and more specifically, the power conversion circuits 126, can be powered by the power generated by the PV cell array 104. For instance, as explained above, the PV cell array 104 can generate a 3-12 volt power supply, a portion of which can power the power conversion device 116. Accordingly, the power conversion device 116 can operate without an external power supply in some configurations. Further, the power conversion device 116 can be self-starting insofar as it can automatically, without human intervention, operate whenever the power conversion device 116 receives sufficient power from the PV cell array 104.

Optionally, the PCB 124 can have a length-to-width aspect ratio between 20:1 and 40:1. The length-to-width aspect ratio of the PCB 124 can allow the PCB 124 to be mounted to an edge, such as the bottom edge, of the PV module 200, rather than on the back of the PV module 200.

Although not shown in FIGS. 1B-1C, the PCB 124 can include one or more control modules disposed on the PCB 124 and configured to control operation of the power conversion circuits 126. Alternately or additionally, each power conversion circuit 126 can include its own control module.

Each of the control modules can comprise a digital controller, microcontroller, processor, microprocessor, or the like.

In some embodiments, the control modules can communicate with each other and/or the power conversion circuits 126 via digital leads 131 formed in the PCB 124. The digital leads 131 can comprise differential or single-ended digital leads. The PCB 124 can alternately or additionally include a plurality of power leads 132A, 132B formed in the PCB 124, including a supply line power lead 132A and a neutral line power lead 132B. Alternately or additionally, the supply line power lead 132A and/or neutral line power lead 132B can be used to carry communications, reducing the number of interconnects that can be implemented in the first and second connectors 128, 130. Alternately or additionally, the supply line power lead 132A and/or neutral line power lead 132B can each comprise a unitary bus or a redundant bus.

The power conversion device 116 can optionally include a cover 133 (FIG. 1B) that cooperates with the housing 122 to enclose the PCB 124, power conversion circuits 126, and other electrical components and to substantially prevent environmental exposure of the PCB 124, power conversion circuits 126 and other electrical components. One or both of the cover 133 and housing 122 can comprise stamped or extruded aluminum or other suitable material(s).

Alternately or additionally, one or more haunch stiffeners 134 (FIG. 1B) can be coupled to the housing 122 to provide structural support to the housing 122. The haunch stiffeners 134 can be stamped and/or can comprise aluminum or other suitable material(s).

In some embodiments of the invention, a plurality of fasteners 135, such as screws, bolts, or the like, can be employed to secure the power conversion device 116 to the housing 122. Alternately or additionally, the fasteners 135 can ground the PCB 124 and other electrical components of power conversion device 116 to the backsheet 110 via housing 122. In this and other embodiments, the PCB 124 can include a plurality of through holes and the housing 122 can include a plurality of tapped holes for receiving fasteners 135. After aligning the through holes of the PCB 124 with the tapped holes of the housing 122, the fasteners 135 can be inserted through the PCB 124 and received in the tapped holes of housing 122 to threadably secure and electrically ground the PCB 124 to the housing 122.

Each of first and second connectors 128, 130 can include connections to the supply line power lead 132A and the neutral line power lead 132B. In some embodiments, the first and second connectors 128, 130 can be coupled to a load or battery storage via, respectively, a complementary second and first connector included in the circuit of the load or battery storage. Alternately or additionally, the first and second connectors 128, 130 can be employed to couple together two or more PV modules 100 in a side-by-side arrangement. For instance, the first connector 128 of a first PV module 100 can be coupled into the second connector 130 of a second PV module 100 that is adjacent to the first PV module 100.

In addition to or instead of implementing first and second connectors 128, 130 that include connections to the supply line power lead 132A and the neutral line power lead 132B, the power conversion device 116 can implement an exposed positive terminal and ground terminal that are connected, respectively, to the supply line power lead 132A and the neutral line power lead 132B.

As mentioned above, one or more control modules can be disposed on the PCB 124 and/or integrated into each of power conversion circuits 126. In some embodiments of the invention, each of the one or more control modules can include an active ground fault detection device coupled to the supply line power lead 132A and the neutral line power lead 132B. The active ground fault detection device can monitor outgoing current in the supply line power lead 132A and returning current in the neutral line power lead 132B. Any imbalance between the outgoing current and returning current, or an "interrupt," can be indicative of a cut or severed power line or other safety hazard in the downstream circuit.

In this and other embodiments, after the active ground fault detection device identifies the interrupt, the control module can switch off the corresponding power conversion circuit 126 to discontinue sending electrical power through the supply line power lead 132A. When the power conversion circuits 126 are switched off, if the PV cells 104 are still generating current, the power conversion circuits 126 can be configured to shunt the current back into the PV cells 104. Because the active ground fault detection device can be incorporated into a control module included in each power conversion circuit 126, the power conversion circuits 126 can be switched off very quickly when an interrupt is detected. Indeed, in some embodiments, the power conversion circuits 126 can be shut down quickly enough that the power conversion device 116 discharges less than 24 joules of energy after identifying the interrupt.

Alternately or additionally, the power conversion circuits 126 can comprise low-power circuits, each having a maximum power output of approximately 50 watts. In this case, each of the power conversion circuits 126 can incorporate one, or not more than two, capacitors having a capacitance between 0.1-50 µF. Due to the relatively small capacitance of the capacitors included in each power conversion circuit 126, the potential energy stored in the capacitors of power conversion circuits 126 and which can potentially be discharged on supply line power lead 132A after an interrupt is detected can be less than 24 joules in aggregate in some embodiments.

As indicated, the maximum energy discharged by power conversion device 116 after detecting an interrupt can be 24 joules. Alternately or additionally, the maximum output voltage of power conversion device 116 can be 60 volts. In some embodiments, the 24-joule and 60-volt limits per power conversion device 116 can allow up to ten PV modules 100 and power conversion devices 116 to be serially connected in a PV system that can qualify as a low voltage device according to standards established by Underwriters Laboratories Inc. ("UL"). The UL low voltage device standard defines a low voltage device as a device that discharges a maximum of 240 joules after detecting an interrupt and that has a maximum voltage of 60 volts. In this particular example, a PV system with ten serially-connected PV modules 100 and power conversion devices 116 can discharge a maximum of 240 joules in aggregate after detecting an interrupt, e.g., ten power conversion devices 116 times 24 joules per power conversion device 116=240 joules, and can have a maximum voltage of 60 volts.

More generally, the maximum output voltage of each power conversion device 116 in a PV system can be 60 volts and the maximum energy discharge of each power conversion device 116 after detecting an interrupt can be less than X/240 Joules of energy, where X is the number of serially connected PV modules 100 in the PV system. Accordingly, if the PV system includes only 5 serially connected PV modules 100, the power conversion circuits 126 for each of five power conversion devices 116 can be shut down quickly enough such that each of the five power conversion devices 116 discharges less than 48 Joules of energy after detecting the interrupt.

A. Power Conversion Circuits

The PCB 124 can include power conversion circuits 126 mounted on the PCB 124. The power conversion device 126 can include 12 power conversion circuits 126, or more or less than 12 power conversion circuits 126 depending on the desired application.

In some embodiments of the invention, each of power conversion circuits 126 can be configured to operate at powers of 100 watts or less and can comprise low-cost, mass-produced consumer electronics. In some instances, each power conversion circuit 126 can operate around a maximum of 25-50 watts.

One or more of the power conversion circuits 126 can be redundant, allowing the power conversion device 116 to operate using less than all of the power conversion circuits 126 at a time. Alternately or additionally, each of the power conversion circuits 126 can have a current capacity of at least 3 times the current generated by the PV cell array 104 under 1 sun of illumination divided by the total number of power conversion circuits 126. For instance, in the embodiment of FIGS. 1A-1C, the PV cell array 104 may generate a maximum current of 60 amps under 1 sun of illumination. In this case, the current generated by the PV cell array 104 (under 1 sun of illumination) divided by 12 power conversion circuits 126 is 5 amps. Accordingly, each power conversion circuit 126 can have a current capacity of at least 3 times 5 amps, or 15 amps in this example.

By implementing redundant power conversion circuits 126 having excess current capacity, the power conversion device 116 may be able to continue operating without any effect on the power output of power conversion device 116 when one or more of the power conversion circuits 126 has failed or is switched off and/or when the PV cells 104 are exposed to illumination exceeding 100%, or the like or any combination thereof As mentioned above, the power conversion device 116 can be redundantly connected to the PV module 100. In particular, the power conversion device 116 can be redundantly connected to the PV module 100 by grounding each of the power conversion circuits 116 into the backsheet 110 and providing separate connections between each power conversion circuit 116 and the PV cells 104 via bottom spacer 108A. The separate connection between each power conversion circuit 116 and the PV cells 104 can include one or more of: traces, leads, and/or solder pads formed in the PCB 124, the fold 110A of backsheet 110, flexible solder ribbon 120 between the bottom spacer 108A and PCB 124, or the like or any combination thereof.

The redundant connection of the power conversion device 116 to the PV module 100 and the inclusion of one or more redundant power conversion circuits 126 can allow the power conversion device 116 to operate as many as all of the power conversion circuits 126 at a time at less than full power, or to operate less than all of the power conversion circuits 126 at a time at full power, or any combination thereof For instance, in operation, and with combined reference to FIGS. 1A and 1C, current can flow from the top spacer 108B to the bottom spacer 108A through the PV cells 104 and spacers 108. At the bottom spacer 108A, the current can be equally divided and received by power conversion circuits 126, each of which can be separately connected to the bottom spacer 108A. Each of the power conversion circuits 126 can then be operated at less than full power to produce a conditioned power output with a stepped up voltage. Alternately or additionally, some of the power conversion circuits 126 can operate at full power while others operate at less than full power.

Alternately or additionally, at least one power conversion circuit 126A can comprise a failed or switched off power conversion circuit 126A. In this case, the current that would have normally been received by power conversion circuit 126A can flow through the bottom spacer 108A to be received by power conversion circuit 126B, 126C, or other power conversion circuit 126. Depending on the number of power conversion circuits 126 that are failed or switched off and the power output of PV cell array 104, all of the remaining power conversion circuits 126 can be operated at full power, or some of the remaining power conversion circuits 126 can be operated at full power while others are operated at less than full power or not at all.

As mentioned above, the power conversion circuits 126 can be configured to provide power conditioning of the electrical power generated by the PV cells 104. As used herein, "power conditioning" can include stepping up the voltage, substantially maintaining maximum peak power of the power supply collectively generated by the PV cells 104, reducing current ripple at the input and output of the power conversion device 116, and/or detecting, monitoring, and maintaining a programmed charge profile for one or more batteries directly connected to the output of power conversion device 116.

The power conversion circuits 126 can provide voltage conversion of the power supply generated by the PV module 100 in order to output a conditioned power supply having a stepped up voltage and stepped down current suitable for long-distance transmission. For instance, the PV cell array 104 may generate 200 watts of direct current ("DC") electrical power at 8 volts and 25 amps. In the absence of power conversion circuits 126, long-distance transmission of such a power supply can be cost-prohibitive as it may require a relatively large, and therefore expensive, conductor.

However, the 200-watt output of PV cell array 104 can be divided among, for instance, five of power conversion circuits 126, such that each of the five power conversion circuits 126 can receive 40 watts of DC electrical power at 8 volts and 5 amps. Further, each of the power conversion circuits 126 can be configured to convert the voltage and current of the DC power supply to a stepped up voltage and a stepped down current. For instance, each of the five power conversion circuits 126 in this example may be able to convert the voltage and current of the individual 40-watt power supply to 54 volts and 0.74 amps. The 54-volt 0.74-amp output of each of the five power conversion circuits 126 can then be output onto the supply line power lead 132A where they combine into a 200-watt power supply at about 54 volts and 3.7 amps, allowing the 200-watt DC power supply to be transmitted long-distance via a relatively smaller and less expensive conductor than would otherwise be required for a 200-watt DC power supply at 8 volts and 25 amps.

In other embodiments of the invention, the power conversion circuits 126 can step up the voltage to as little as 12 volts or as much as 60 volts. Alternately or additionally, each of the power conversion circuits 126 can be configured to release less than 2 joules of energy after an interrupt is detected and the power conversion circuits 126 are switched off Each one of the power conversion circuits 126 can comprise a step-up DC-DC converter with an output DC voltage that is greater than its input DC voltage. Examples of step-up DC-DC converters include boost converters, buck-boost converters, SEPIC converters, and Ćuk converters.

Figure 2A:
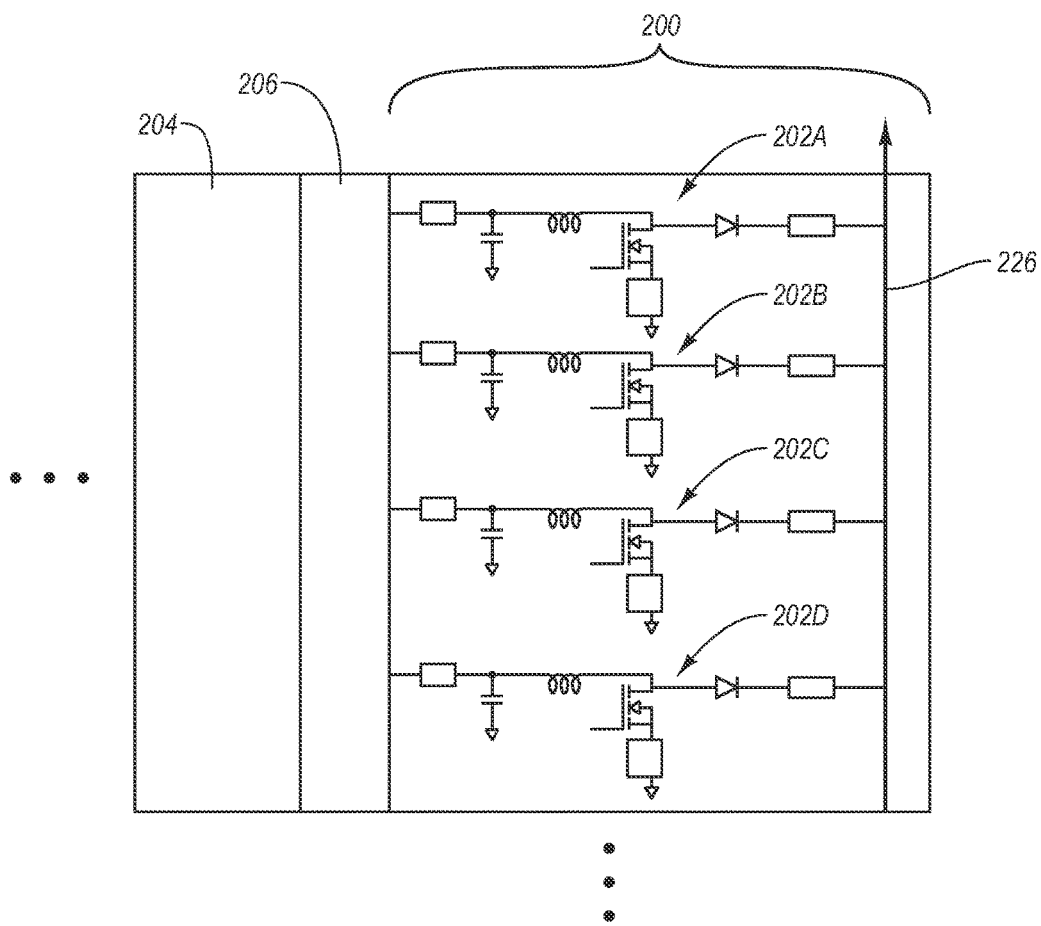
FIGS. 2A-2C disclose aspects of a power conversion device that can be implemented in a PV module, such as the PV module of FIGS. 1A-1D.

For instance, FIG. 2A discloses a power conversion device 200 including a plurality of power conversion circuits 202A-202D (collectively "power conversion circuits 202") comprising boost converters. The power conversion device 200 and power conversion circuits 202 may correspond to, respectively, the power conversion device 116 and power conversion circuits 126 of FIGS. 1A-1C.

FIG. 2A additionally discloses a bottom row 204 of PV cells and a bottom spacer 206 that may correspond to, respectively, the bottom row 106A and bottom spacer 108A of FIGS. 1A-1C. As shown in FIG. 2A, each of power conversion circuits 202 is separately coupled to the bottom row 204 of PV cells via bottom spacer 206, such that the power conversion device 200 is redundantly coupled to the bottom row 204—and other corresponding rows of PV cells—in a PV module.

Figure 2B:
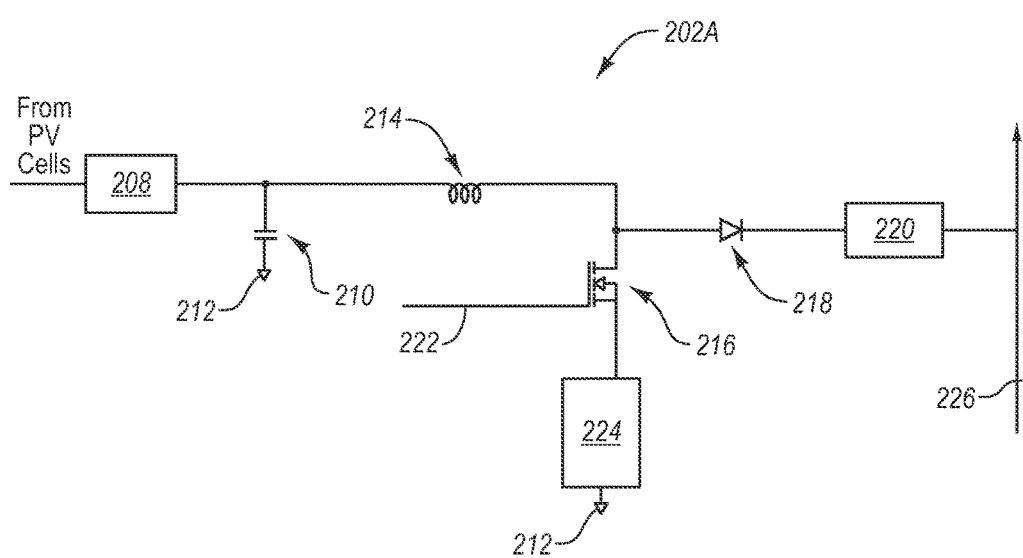

With additional reference to FIG. 2B, aspects of power conversion circuit 202A will be disclosed, noting that power conversion circuits 202B-202D can be substantially identical to power conversion circuit 202A. The power conversion circuit 202A can include one or more components not shown in FIG. 2A, such as components for fusing, safety, and/or other purposes, but such components are not shown in FIG. 2A for clarity. Further, power conversion circuit 202A is merely an example of one step-up DC-DC converter that can be employed according to embodiments of the invention and should not be construed to limit the invention in any way. Indeed, embodiments of the invention include step-up DC-DC converters that can be configured differently than the power conversion circuit 202A.

As shown in FIG. 2B, power conversion circuit 202A can include an input 208, a capacitor 210 coupled to the input 208 and to ground 212, an inductor 214 coupled to the input 208 and to capacitor 210, a switch 216 coupled to the inductor 214, a diode 218 coupled to the inductor 214 and to switch 216, an output 220 coupled to diode 218, a control line 222 coupled to the switch 216, and one or more measurement circuits 224 coupled between power conversion circuit 202A and ground 212.

With combined reference to FIGS. 2A and 2B, the input 208 can be coupled to the bottom row 204 of PV cells via bottom spacer 206. The output 220 can be coupled to a power supply bus 226 (FIG. 2A) that may correspond to the supply line power lead 132A of FIG. 1C. The control line 222 can be coupled to a control module (not shown) that can be included in the power conversion circuit 202A and/or that can be shared between two or more of the power conversion circuits 202. In some embodiments, the control module can provide a pulse-width modulated ("PWM") control signal to the switch 216 that controls the switching frequency and/or duty cycle of power conversion circuit 202A. Alternately or additionally, the PWM control signal can control the phasing of power conversion circuit 202A relative to the phasing of power conversion circuits 202B-202D. Alternately or additionally, the PWM control signal can be generated by a crystal oscillator (not shown) disposed within power conversion device 200 external to the power conversion circuit 202A. In some cases, the power conversion device 200 can include a plurality of crystal oscillators, one each for power conversion circuits 202A-202E.

The switch 216 can comprise a field-effect transistor ("FET"), a metal-oxide-semiconductor FET ("MOSFET"), an insulated-gate bipolar transistor ("IGBT"), a bipolar junction transistor ("BJT"), or other suitable switch. The diode 218 can comprise a Schottky rectifier, or other suitable diode.

The measurement circuit 224 can include one or more resistors and can be employed to measure certain operating parameters of the power conversion circuit 202A. For instance, the measurement circuit 224 can measure the maximum current buildup per switching cycle in inductor 214 in order to maintain maximum peak power. Alternately or additionally, the measurement circuit 224 can measure the charging rate of the inductor 214, the input voltage of power conversion circuit 202A, the output voltage of power conversion circuit 202A, or the like or any combination thereof. Aspects of measurement circuit 224 will be described in greater detail below.

In operation, the power conversion circuit 202A can receive unconditioned power generated by PV cells at input 208 and step up the voltage by switching itself on and off via switch 216. In the on-state, the switch 216 is closed such that the current flowing through inductor 214 can increase and returns to ground 212 through the switch 216 and measurement circuit 224. In the off-state, the switch 216 is open such that the current flowing through the inductor 214 can decrease, flowing through the diode 218 and output 220 to power supply bus 226.

In the on-state of power conversion circuit 202A, the voltage at output 220 can be about 0 volts. In the off-state, the voltage at output 220 can depend on the rate of change of current through inductor 214, rather than on the input voltage at input 208. In turn, the rate of change of current through inductor 214 can depend on the inductance of the inductor 214. Accordingly, the step-up voltage at output 220 can depend on the inductance of inductor 214. Alternately or additionally, the step-up voltage at output 220 can depend on the switching frequency of switch 216 and/or the duty cycle of switch 216.

By cycling the power conversion circuit 202A on and off in continuous mode, e.g., the current through the inductor never reaches 0 amps, the power conversion circuit 202A can produce conditioned power, e.g., power having a stepped up voltage, at output 220.

In this and other embodiments, the switch 216 can be operated via control line 222. In particular, a control module can send signals, directly or indirectly via a gate driver, over control line 222 to open and close the switch 216 at a desired frequency and duty cycle. Because each of the step-up voltage and the impedance of the power conversion circuit 202A can depend on the frequency and duty cycle of the switching process, the control module that controls the switch 216 can set the frequency and/or duty cycle at a predetermined frequency and/or duty cycle to optimize the step-up voltage and the impedance of the power conversion circuit 202A.

In some cases, the opening and closing of switch 216 can generate electromagnetic interference ("EMI"). The frequency of the EMI can depend on the switching frequency of switch 216. The Federal Communications Commission ("FCC") and/or other bodies may define limits on allowable EMI peak energies at any specific EMI frequency. To avoid exceeding such limits, the power conversion circuit 202A, and more particularly, the switch 216, can be operated with a spread spectrum switching frequency, such that the energy generated by EMI is spread across a spectrum of frequencies rather than being concentrated at any specific frequency.

With combined reference now to FIGS. 2A and 2B, in some embodiments, the constantly increasing and decreasing current through the inductor 214 can cause periodic variations in the amplitude of the input current and/or output current of power conversion circuit 202A. These periodic variations in the current amplitude are also known as current ripple. Current ripple at the input of power conversion circuit 202A can cause the impedance of the power conversion circuit 202A to vary as a function of the current ripple, making it difficult for the power conversion circuit 202A to maintain maximum peak power. Current ripple at the output of power conversion circuit 202A can result in a noisy power supply that may negatively affect a load coupled to the power supply.

However, current ripple can be substantially reduced at the input and output of power conversion device 200 as a whole by operating the power conversion circuits 202A-202D out of phase with each other. When the power conversion circuits 202A-202D are operating out of phase with each other, the amplitude of current ripple in one of power conversion circuits 202A-202D can be increasing while the amplitude of current ripple in another of power conversion circuits 202A-202D can be decreasing. The cumulative effect of the out-of-phase operation of power conversion circuits 202A-202D can average out the current ripple at the input and output of the power conversion device 200 as a whole.

As mentioned above, measurement circuit 224 can measure one or more operating parameters of power conversion circuit 202A. One embodiment of a power conversion circuit 202E disclosing additional details of a plurality of measurement circuits is disclosed in FIG. 2C. The power conversion circuit 202E of FIG. 2C may correspond to one or more of power conversion circuits 202A-202D in FIGS. 2A and 2B.

Similar to power conversion circuits 202A-202D, power conversion circuit 202E can include an input 208A, a capacitor 210A coupled to the input 208A and to ground 212A, an inductor 214A coupled to the input 208A and to capacitor 210A, a switch 216A coupled to the inductor 214A, a diode 218A coupled to the inductor 214A and to switch 216A, an output 220A coupled to diode 218A, a control line 222A coupled to the switch 216A, and one or more measurement circuits 224A-224C coupled to power conversion circuit 202E.

In more detail, a first measurement circuit 224A can include a plurality of resistors R1 and R2 coupled between the input of capacitor 210A and ground 212A. A first analog to digital converter ("ADC") 228 can be coupled to the first measurement circuit 224A between resistors R1 and R2 to measure the input voltage of the power conversion circuit 202E received from a plurality of PV cells.

A second measurement circuit 224B can include a resistor R3 coupled between an input of the switch 216A and a second ADC 230. The second ADC 230 can measure the current flowing through inductor 214A to determine, among other things, the maximum current buildup per switching cycle in inductor 214A and/or the charging rate of the inductor 214A.

A third measurement circuit 224C can include a plurality of resistors R4 and R5 coupled between the output of diode 218A and ground 212A. A third ADC 232 can be coupled to the third measurement circuit 224C between resistors R4 and R5 to measure the stepped up output voltage of power conversion circuit 202E.

Figure 2C:
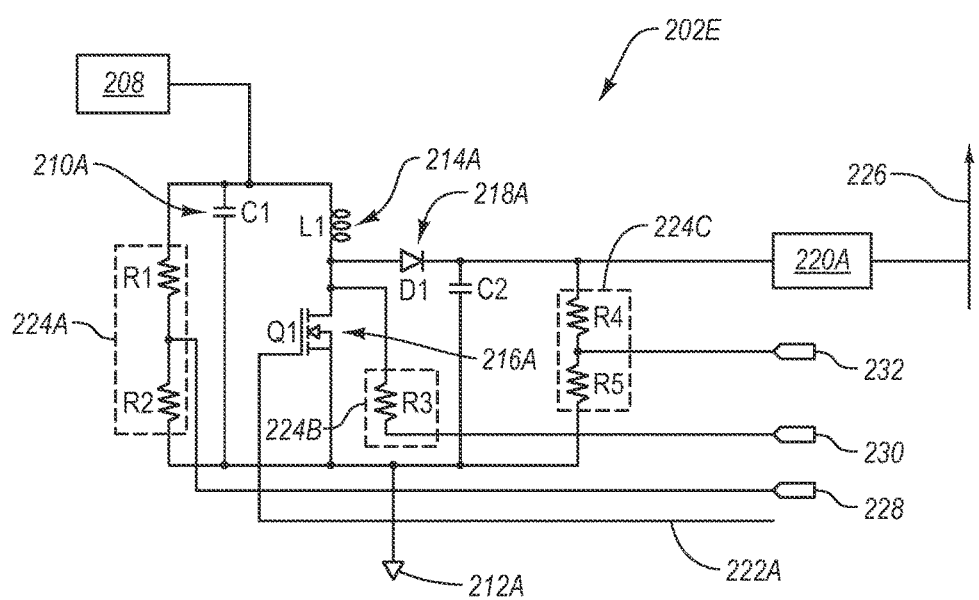

With combined reference to FIGS. 2A-2C, the power conversion circuits 202A-202E can each generally be configured to output a stepped up voltage between 12-60 volts from an input voltage of 3-12 volts. The stepped up voltage can be regulated by one or more control modules included in the power conversion device 200 to a particular voltage that may match a load voltage of a load driven by the conditioned power output of the power conversion device 200.

For instance, 12-volt batteries commonly used in conjunction with PV modules can be located a relatively short distance from the PV modules, such that a 12-volt output for charging the batteries is suitable for the short-distance transmission. Alternately or additionally, the batteries can comprise 24- or 48-volt batteries and/or the distance to the batteries can be relatively farther away such that a 24- or 48-volt output can be more suitable. Alternately or additionally, a 60-volt output can be suitable for even longer transmission distances. Alternately or additionally, the power conversion circuits 202A-202E can output a stepped up voltage at some other predetermined voltage.

B. Two-Stage Power Conversion

FIGS. 1C and 2A disclose power conversion devices 116 and 200 that can implement a single voltage gain stage, comprising power conversion circuits 126 and 202A-202D, respectively. Embodiments of the invention can alternately or additionally include power conversion devices that implement multiple voltage gain stages. For instance, each of FIGS. 3A and 3B disclose power conversion devices 300A and 300B comprising dual voltage gain stages.

In more detail, FIG. 3A discloses power conversion device 300A comprising a PCB 302A, first and second complementary connectors 304A, 306A, a plurality of digital leads 308A, and first and second voltage gain stages 310A and 312A. Each of the first and second voltage gain stages 310A, 312A can comprise a plurality of redundant power conversion circuits 314A and 316A, respectively. The power conversion device 300A can additionally include ground pads 318A (grounding not shown) for grounding each of the power conversion circuits 314A and 316A, an input bus 320A, an intermediate bus 322A, and a power supply bus 324A.

An input of each of the power conversion circuits 314A in the first voltage gain stage 310A can be connected to the PV cells of a corresponding PV module via input bus 320A. An output of each of the power conversion circuits 314A in the first voltage gain stage 310A can be connected to intermediate bus 322A.

An input of each of the power conversion circuits 316A in the second voltage gain stage 312A can be connected to the output of power conversion circuits 314A in the first voltage gain stage 310A via intermediate bus 322A. An output of each of the power conversion circuits 316A in the second voltage gain stage 312A can be connected to power supply bus 324A.

In operation, unconditioned power output having a first voltage that is received from the PV cells of a corresponding PV module can be provided to the first voltage gain stage 310A via input bus 320A. The unconditioned power output can be divided amongst one or more of the power conversion circuits 314A and stepped up to a second voltage that the power conversion circuits 314A can output onto intermediate bus 322A.

The second voltage gain stage 312A is connected to the intermediate bus 322A such that the power output of the first gain stage 310A on intermediate bus 322A can be divided amongst one or more of the power conversion circuits 316A of the second gain stage 312A. The power conversion circuits 316A step up the voltage to a third voltage that is output onto power supply bus 324A.

Accordingly, in this and other embodiments, the first and second voltage gain stages 310A, 312A can cooperate to step up the output voltage beyond that efficiently reachable by a single voltage gain stage.

In some embodiments of the invention, each of power conversion circuits 314A, 316A can include an integrated control module. Although not shown, each of the control modules can be connected to digital leads 308A to communicate.

FIG. 3B discloses a power conversion device 300B that may be similar in some respects to the power conversion device 300A of FIG. 3A. For instance, power conversion device 300B can comprise a PCB 302B, first and second complementary connectors 304B, 306B, a plurality of digital leads 308B, and first and second voltage gain stages 310B and 312B. Each of the first and second voltage gain stages 310B, 312B can comprise a plurality of redundant power conversion circuits 314B and 316B, respectively. The power conversion device 300B can additionally include ground pads 318B (grounding not shown) for grounding each of the power conversion circuits 314B and 316B, an input bus 320B, an intermediate bus 322B, and a power supply bus 324B.

In contrast to the power conversion device 300A of FIG. 3A, the power conversion device 300B of FIG. 3B can include a plurality of shared control modules 326. As mentioned above with respect to FIG. 3A, each of the power conversion circuits 314A, 316A of power conversion device 300A can include its own integrated control module. In the embodiment of FIG. 3B, however, none of the power conversion circuits 314B, 316B includes its own control module. Instead, shared control modules 326 are provided that can each operate multiple power conversion circuits 314B, 316B. For instance, each of control modules 326 can operate four power conversion circuits 314B, 316B in the embodiment of FIG. 3B. In other embodiments, control modules 326 can be shared between more or less than four power conversion circuits 314B, 316B. In this and other embodiments, control modules 326 can communicate with each other via digital leads 308B.

C. Maintaining Maximum Peak Power

Figure 4:
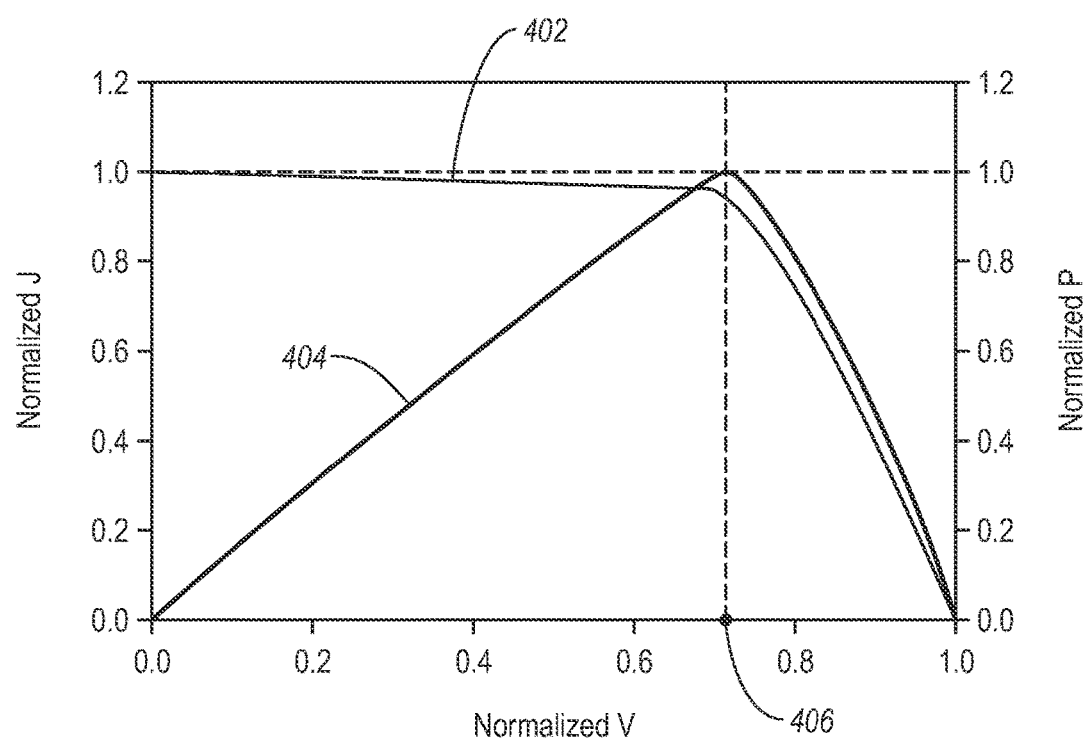
FIG. 4 discloses example IV and PV curves for a PV cell or PV module.

With combined reference to FIGS. 1A-2C, and as mentioned above, the maximum value of the current buildup and/or the charging rate of the inductor 214 can be used by the power conversion circuits 202A-202E in maintaining peak power of a corresponding PV module, such as the PV module 100. Maintaining peak power can maximize the unconditioned power output of PV cell array 104, and consequently of the conditioned power output from power conversion device 116 or 200. As will be explained below, maintaining peak power can generally include (1) identifying a peak power point at which power output of the PV cell array 104 is maximized and (2) setting the impedance of the power conversion circuits 202A-202E to effectively match the impedance of a load such that the voltage across the PV cell array 104 is substantially equal to the identified peak power point As an aid in understanding peak power tracking, FIG. 4 graphically discloses the current and power of an example PV cell or PV cell array as a function of voltage. The x-axis can represent normalized voltage V (e.g., actual voltage divided by maximum voltage). The left y-axis can represent normalized current J. The right y-axis can represent normalized power P. FIG. 4 includes an IV curve 402 and a PV curve 404. IV Curve 402 and PV curve 404 can include, respectively, data representative of the current and the power of the PV cell or PV cell array as a function of voltage.

With reference first to IV curve 402 the current is at a maximum of 1 when the voltage is 0, e.g., when the PV cell or PV cell array is shorted into itself. As the voltage is increased from 0 to about 0.7, the current gradually decreases to more than 0.9. As the voltage increases beyond about 0.7, the PV cell or PV cell array can become biased beyond its capabilities and the current begins to drop off rapidly until it reaches 0 at a voltage of 1.

With reference next to PV curve 404, power is the product of voltage and current. In this case, each of the data points of PV curve 404 may be equal to the product of the voltage and current of the IV curve 402 data points. As seen in FIG. 4, the power is at a minimum of 0 when either one of the voltage or current is equal to 0. Further, the power increases from 0 to a maximum of 1 as the voltage increases from 0 to about 0.7, and then falls off to 0 as the voltage increases from about 0.7 to 1.

The PV curve 404 can be referred to as a maximum peak power curve and can be used to identify a peak power point 406, i.e., a predetermined voltage, at which power produced by a PV cell or PV cell array can be maximized. In particular, in this example, the power generated by the PV cell or PV cell array can be maximized at a peak power point 406 of about 0.7.

The peak power point 406 for a PV cell or PV cell array can vary as a function of, among other things, illumination intensity. For example, the peak power point 406 of a PV cell or PV cell array exposed to direct sunlight can change when the PV cell or PV cell array is overshadowed by a cloud or other object.

Further, the PV cell or PV cell array can be used to drive a load or loads that can have an impedance that is not matched to the impedance of the PV cell or PV cell array. When the PV cell or PV cell array is not impedance matched to the load, the PV cell or PV cell array may have to operate at a voltage that is above or below the peak power point 406 to drive the load. As can be seen with respect to the PV curve 404 of FIG. 4, the power output of a PV cell or PV cell array is not maximized when the PV cell or PV cell array does not operate at the peak power point 406. Further, in some cases, the impedance of the load can vary when, for example, devices are switched in and out of the circuit driven by the PV cell or PV cell array.

Returning to FIGS. 1A-2C, embodiments of the invention can accordingly include power conversion circuits 202A-202E configured to maintain maximum peak power of the PV cell array 104 to maximize the power output of PV cell array 104. As used herein, maintaining maximum peak power for a PV cell array such as PV cell array 104 can include (1) identifying the peak power point of the PV cell array 104 at which power output from the PV cell array 104 is maximized and (2) setting the impedance of the power conversion circuits 202A-202E to match the impedance of a load such that the voltage across the PV cell array 104 is substantially equal to the identified peak power point.

In some embodiments, the impedance of the power conversion circuits 202A-202E can be set such that the voltage across the PV cell array 104 is within 10% of the available peak power point. Alternately or additionally, the impedance of the power conversion circuits 202A-202E can be set such that the voltage across the PV cell array 104 is within 2% of the available peak power point averaged over time.

Power conversion devices 116, 200 can implement any method now known or later developed for maintaining maximum peak power for PV cell array 104. For example, power conversion devices 116, 200 can implement a circuit switching method, a perturb and observe method, an AC ripple control method, a fixed Voc offset method, or the like or any combination thereof. In some embodiments, the power conversion device 116, 200 can implement a circuit switching method in combination with one or more other methods.

Figure 5A:
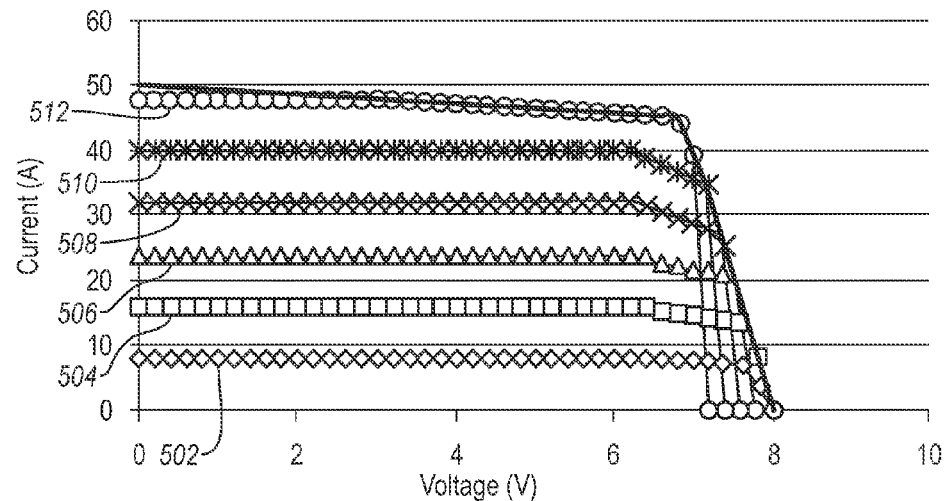
FIGS. 5A-5C disclose example IV, PV and differential PV curves for a PV module with a variable number of switched on power conversion circuits.
Figure 5B:
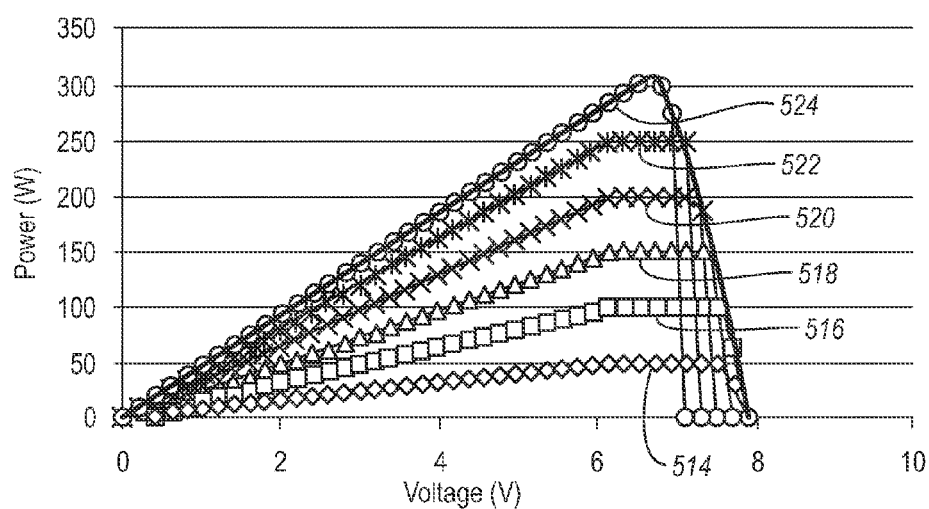
Figure 5C:
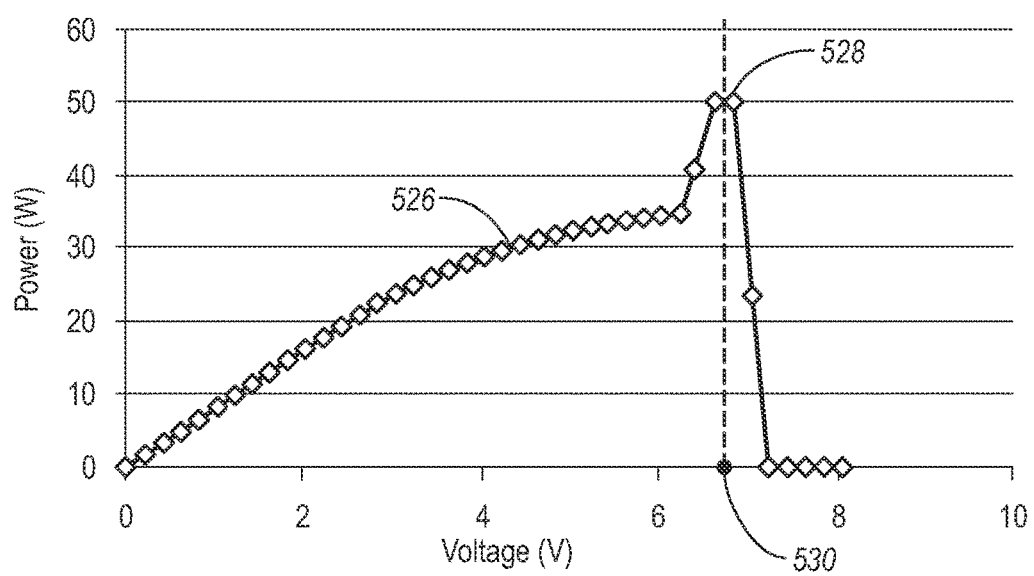

One embodiment of a circuit switching method for maintaining maximum peak power will now be disclosed with respect to the power conversion device 116 of FIG. 1C and FIGS. 5A-5C. FIGS. 5A-5B depict, respectively, IV curves 502-512 and PV curves 516-524 of the input power of power conversion device 116 under constant illumination with different numbers of operational power conversion circuits 126. FIG. 5C depicts a differential PV curve 526 when the last power conversion circuit 126 needed to reach the maximum peak power point is switched on.

In FIG. 5A, IV curve 502 depicts the input current (y-axis) of power conversion device 116 as a function of input voltage (x-axis) when one power conversion circuit 126 operating at 100% capacity is operational. Similarly, IV curves 504-512 depict the input current of power conversion device 116 as a function of input voltage when two, three, four, five, or six power conversion circuits 126 operating at 100% capacity are operational.

In FIG. 5B, PV curve 514 depicts the input power (y-axis) of power conversion device 116 as a function of input voltage (x-axis) when one power conversion circuit 126 operating at 100% capacity is operational. Similarly, PV curves 516-524 depict the input power of power conversion device 116 as a function of input voltage when two, three, four, five, or six power conversion circuits 126 operating at 100% capacity are operational.

Each of power conversion circuits 126 can be a current bottleneck. For instance, in FIG. 5A, each of power conversion circuit 126 can allow a maximum of 8 amps to flow at 100% capacity, such that when there are one, two, three, four, five, or six operational power conversion circuits 126, the maximum current at 0 volts is 8 amps, 16 amps, 24 amps, 32 amps, 40 amps, or 48 amps, respectively.

Whereas power is equal to the product of voltage and current, identifying the maximum peak power point of the PV module 100 can require allowing all of the current of the PV cells 104 of PV module 100 to flow into the power conversion device 116. In this example, all of the current of PV cells 104 cannot flow into the power conversion device 116 when one, two, three, four, or five power conversion circuits 126 are operational, as indicated by curves 502-510. In particular, in each of IV curves 502-510, the current remains constant from 0 volts until after 6 volts where the current gradually decreases before rolling off sharply. In contrast, in an IV curve where the maximum amount of current is allowed to flow, such as in the IV curve 402 of FIG. 4, the current gradually decreases beginning at 0 volts up to the peak power point where the current rolls off sharply.

After the sixth power conversion circuit 126 is switched on, however, the maximum current from the PV cells 104 can flow into the power conversion device 116, as indicated by IV curve 512. In particular, in IV curve 512, the current gradually decreases beginning at 0 volts up to the peak power point where the current rolls off sharply.

The inability of maximum current to flow into power conversion device 116 prior to switching on the sixth power conversion circuit 126 manifests itself as a maximum power plateau in the PV curves 514-522 of FIG. 5B. For instance, as seen with PV curves 514-522, when one to five power conversion circuits 126 are operational, the input power of power conversion device 116 gradually increases from 0 volts until after 6 volts where the power plateaus and then sharply drops.

In contrast, in a PV curve where the maximum amount of current is allowed to flow, such as in the PV curve 404 of FIG. 4, the power gradually increases beginning at 0 volts up to the peak power point where the power rolls off sharply without reaching a plateau. For example, as seen with PV curve 524, when the sixth power conversion circuit 126 is switched on, the power gradually increases beginning at 0 volts up to the peak power point where the power rolls off sharply without reaching a plateau.

In more general terms, the total number of power conversion circuits 126 that may be required to allow all the current from PV module 100 to flow into power conversion device 116 can be denoted "N". Comparison of power conversion device's 116 PV curves 522, 524 for N−1 and N operational power conversion circuits 126 can facilitate identification of the peak power point. In particular, FIG. 5C discloses a differential PV curve 526 generated by subtracting PV curve 522 for N−1 operational power conversion circuits 126 from PV curve 524 for N operational power conversion circuits 126.

As seen in FIG. 5C, the subtraction of PV curve 522 from PV curve 524 results in a differential PV curve 526 having a well-defined maximum power 528. The peak power point 530 corresponding to the maximum power 528 can then be easily identified. Further, the identification of the peak power point 530 corresponding to the maximum power 528 using the circuit switching method described with respect to FIGS. 5A-5C can be a continuous process as illumination conditions of the PV cells 104 change.

Once the peak power point 530 has been identified using a circuit switching method such as described with respect to FIGS. 5A-5C, the power conversion circuits 126 can implement a perturb and observe method, an AC ripple control method, a fixed Voc offset method, or other method now know or later developed to set the impedance of one or more of the power conversion circuits 126 to match the impedance of a load being driven by the PV module 100.

For example, using a perturb and observe method in combination with the circuit switching method of FIGS. 5A-5C, after switching on an Nth power conversion circuit 126 that allows maximum current to flow into power conversion device 116, the duty cycle and/or switching frequency of the Nth power conversion circuit 126 can be initially varied. An input voltage and an input current of the Nth power conversion circuit 126 can be detected to calculate a corresponding input power. Each new value of the calculated input power can be compared to the previous value of calculated input power in determining a direction of fluctuation of the duty cycle and/or switching frequency of the Nth power conversion circuit 126. If a change of the duty cycle and/or switching frequency results in a power increase, the duty cycle and/or switching frequency can be changed again in the same direction. However, if a change of the duty cycle and/or switching frequency results in a power decrease, the duty cycle and/or switching frequency can be changed in the opposite direction.

Accordingly, using a circuit switching method in combination with one or more other methods, N power conversion circuits 126 can be switched on, with N−1 of the N power conversion circuits 126 operating at 100% capacity. In this example, only the Nth power conversion circuit 126 operates at less than 100%. In this and other embodiments, operating the N−1 power conversion circuits 126 at 100% capacity and the Nth power conversion circuit 126 at less than 100% capacity can be more efficient than operating more than N power conversion circuits 126, each at less than 100% capacity.

Further, in this and other embodiments, the Nth power conversion circuit 126 may be the only one of the N power conversion circuits 126 maintaining maximum peak power since the N−1 power conversion circuits 126 can be operating at 100% capacity. In some instances, maintaining maximum peak power using a single power conversion circuit 126 at a time can be simpler than maintaining maximum peak power using multiple power conversion circuits 126 each operating at less than 100% capacity.

Further, in some embodiments of the invention, the Nth power conversion circuit 126 operating at less than 100% and maintaining maximum peak power can rotate from one power conversion circuit 126 to another. Alternately or additionally, one or more of the N power conversion circuits 126 can be switched off while one or more redundant power conversion circuits 126 that weren't previously operating can be switched on to replace the ones that were switched off.

When N is less than the total number of available power conversion circuits 126, the power conversion circuits 126 can be on/off cycled, e.g., intermittently switched on or off, by one or more control modules such that the power conversion circuits 126 take turns operating with no more than N operating at a time. The determination of which power conversion circuits 126 to operate at a time can depend on one or more factors. For example, the one or more factors can include the amount of time each power conversion circuit 126 has been operated, the operating temperature of each power conversion circuit 126, or the like or any combination thereof.

In this and other embodiments, control modules included in power conversion circuits 126 or control modules shared by power conversion circuits 126 can monitor and track the one or more factors considered in on/off cycling the power conversion circuits 126. Alternately or additionally, a master control module can be included in the power conversion device 116 to coordinate the on/off cycling of power conversion circuits 126. In either case, coordination of the on/off cycling of power conversion circuits 126 can include the control modules communicating with each other and/or with a master control module via digital leads 131 to coordinate the on/off cycling of the power conversion circuits 126. The control modules can implement a predetermined protocol to communicate with each other, including one or more of the 1-wire protocol, the I²C protocol, a wireless communication protocol, or the like or any combination thereof.

Further, the one or more factors considered in on/off cycling of the power conversion circuits 126 can be used to remove one or more power conversion circuits 126 from operation. For instance, if a control module determines that an operating temperature of a power conversion circuit 126 is above a predetermined limit, indicating that the power conversion circuit 126 has failed, the control module can switch the power conversion circuit 126 off and/or can communicate with the other control modules via digital leads 131 to let the other control modules know that the power conversion circuit 126 has been removed from operation.

Alternately or additionally, each power conversion circuit 126 can include a fuse to protect the power conversion circuit 126 from switches that can short closed, such as the switches 216, 216A of FIGS. 2B and 2C. In this example, when a switch shorts closed, the fuse can blow to prevent the closed switch in the power conversion circuit 126 from impairing operation of the power conversion device 116. In this case, the power conversion circuit 126 has failed. Accordingly, the power conversion device 116 can include control modules, fuses, or other devices for identifying failed power conversion circuits 126 and removing the failed power conversion circuits from operation.

As mentioned above, the power conversion circuits 126 can be redundant. Further, the power conversion circuits 126 can be connected in parallel with the rows 106 of PV cells 104. Accordingly, when one or more of the power conversion circuits 126 has failed, the failed power conversion circuit 126 can be removed from operation without affecting operation of the PV module 100. For instance, as explained above, when the power conversion circuit 126A is failed or otherwise not switched on, current from the PV cells 104 can flow through the bottom spacer 108A to one or more of power conversion circuits 126B, 126C.

II. Passive Row-Balancing

Embodiments of the invention can include PV modules that passively row-balance current across PV cells in each row and/or across rows in the PV module. As used herein, "passive row-balancing of current" refers to passively channeling current around one or more blocked PV cells or rows. As used herein, a PV cell is "blocked" if the current generated by the PV cell is substantially lower than the current generated by other PV cells in the same row. Similarly, a row is "blocked" if the current generated by the row is substantially lower than the current generated by other rows in the PV module.

The PV module 100 of FIG. 1A is one example of a PV module 100 that can implement passive row-balancing of current across the PV cells 104 in each row 106. Passive row-balancing of current across the PV cells 104 in each row 106 can be implemented by coupling the PV cells 104 within each row 106 to each other in parallel via conductive spacers 108. Accordingly, if a PV cell 104C in top row 106B is blocked, the current that would otherwise flow through PV cell 104C can flow around PV cell 104C via top spacer 108B and then through one or more of the other PV cells 104 of top row 106B.

Figure 6:
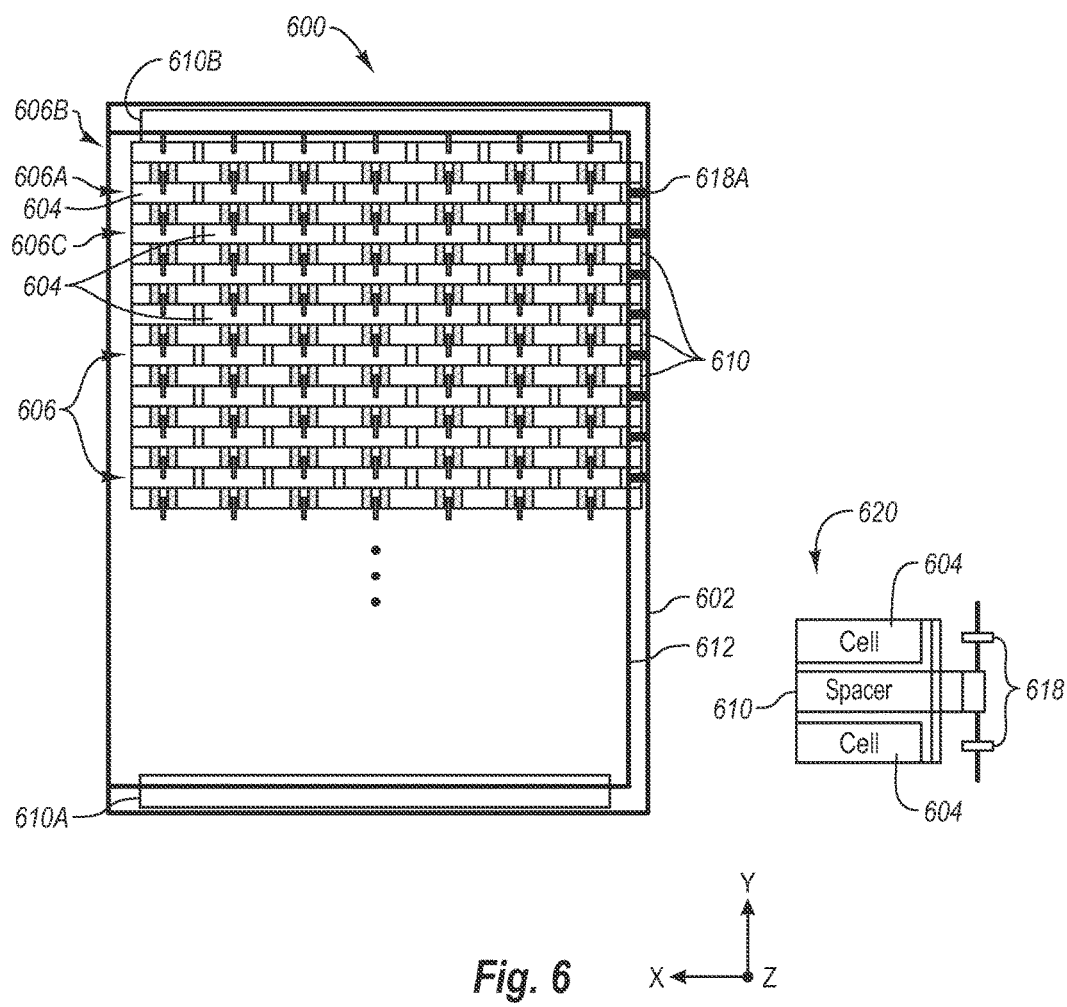
FIG. 6 discloses aspects of an example PV module that can include a redundantly connected power conversion device and a plurality of bypass diodes.

As another example, FIG. 6 discloses an example PV module 600 that additionally implements passive row-balancing across the rows within the PV module 600. In particular, FIG. 6 depicts a simplified back view of PV module 600. The PV module 600 of FIG. 6 can be similar in some respects to the PV module 100 of FIG. 1A. For instance, the PV module 600 can comprise a front plate 602, a plurality of PV cells 604 (collectively "PV cell array 604") disposed beneath the front plate 602 that can be arranged in rows 606, a plurality of spacers 610—including a bottom spacer 610A and top spacer 610B—interposed among the rows 606 of PV cells 604, a backsheet 612—displayed transparently in FIG. 6 to allow the PV cells 604 to be seen—and a power conversion device (not shown) redundantly connected to PV cells 604 via bottom spacer 610A.

Although not shown in FIG. 6, the PV module 600 can further include an adhesive layer, buffer layer and/or other components included in the PV module 100.

As shown, the PV module 600 can implement passive row-balancing of current across the PV cells 604 of each row 606 by coupling the PV cells 604 of each row in parallel with each other. In addition, the PV module 600 can implement passive row-balancing of current across the rows 606 by incorporating a plurality of bypass diodes 618. FIG. 6 includes an inset 620 depicting the connection of the bypass diodes 618 to the PV module 600. As shown in the inset 620, the bypass diodes 618 can be coupled to each other in series via the spacers 610. Further, each of bypass diodes 618 can be coupled in anti-parallel with the PV cells 604 of an adjacent row 606. For instance, bypass diode 618A is disposed adjacent to row 606A and can be coupled in anti-parallel with the PV cells 604 of row 606A.

In some embodiments, the bypass diodes 618 can allow current to flow around rows 506 that are blocked. For instance, row 606A can be a blocked row due to non-uniform illumination conditions of the PV cells 604 of row 606A and/or due to one or more failed or underperforming PV cells 604 in the row 606A.

When a row 606A is blocked, the current produced by the row 606A can be lower than the current produced by the other rows 606 such that the row 606A becomes a current bottleneck, limiting the current of every other row 606 to the current of row 606A. As a result, the row 606A, in the absence of bypass diodes 618, can effectively contribute a voltage loss—and consequently a power loss—to the power output collectively generated by the PV cells 604 that reaches the bottom spacer 610A and the power conversion device redundantly coupled to the bottom spacer 610A.

In operation, however, because each bypass diode 618 is connected in antiparallel with a corresponding row 606, when the voltage imbalance across a blocked row 606A becomes sufficiently large, the corresponding bypass diode 618 can open up and allow current to flow around the blocked row 606A. Thus, in the example of FIG. 6, when the voltage imbalance across blocked row 606A becomes sufficiently large, bypass diode 618A can open up to allow current to flow from row 606B through bypass diode 618A and around blocked row 606A to row 606C.

III. Active Row-Balancing

Embodiments of the invention can alternately or additionally include PV modules that actively row-balance current across rows in the PV module. As used herein, "active row-balancing of current" refers to inputting module power or channeling current around one or more blocked rows using one or more active electronic devices.

Figure 7A:
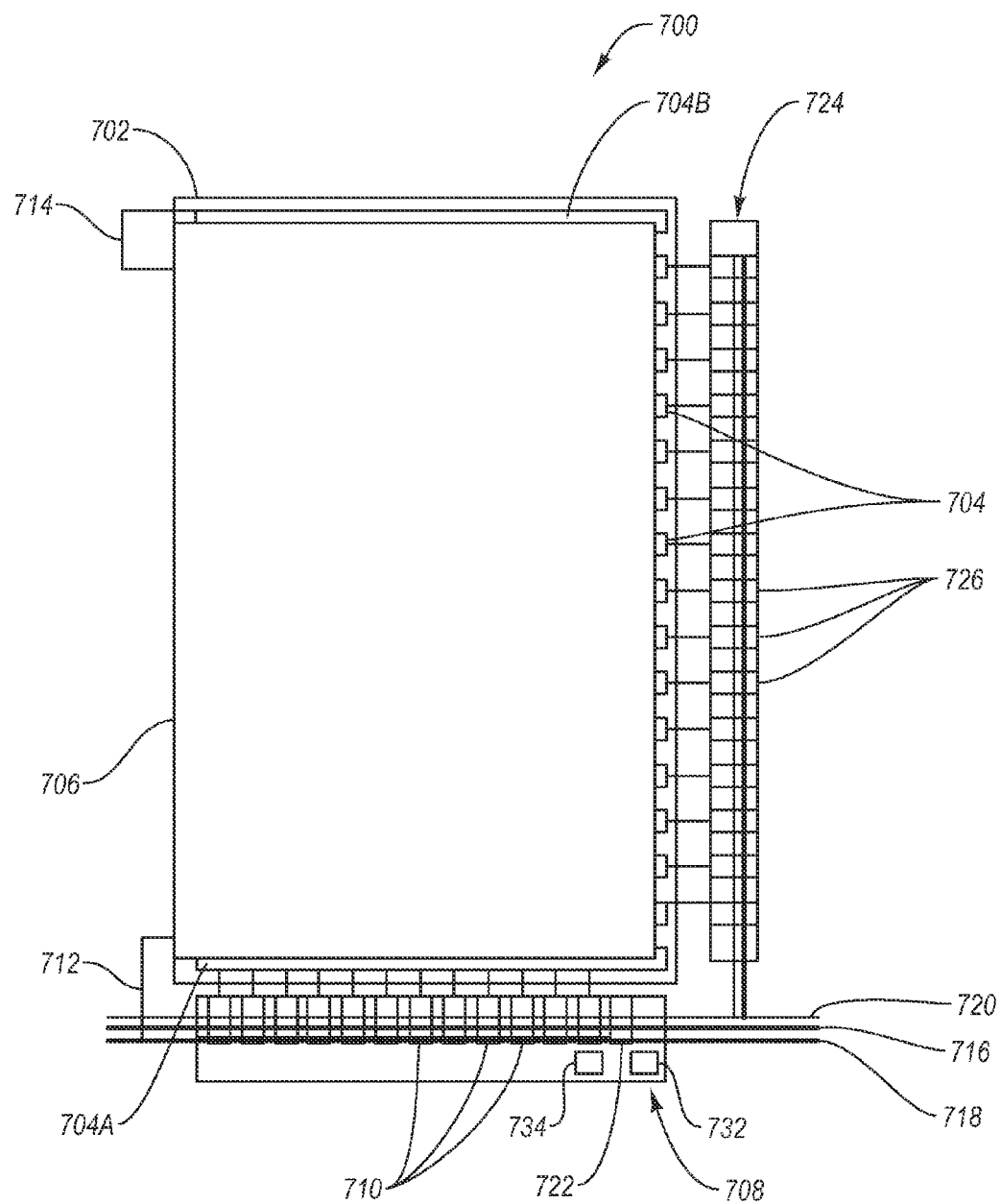
FIG. 7A discloses aspects of an example PV module that can include a redundantly connected power conversion device and an active row-balancing device.

For instance, FIG. 7A discloses an example PV module 700 that can implement active row-balancing across the rows within the PV module 700. In particular, FIG. 7A depicts a simplified back view of PV module 700. The PV module 700 of FIG. 7A can be similar in some respects to the PV module 100 of FIG. 1A. For instance, the PV module 700 can comprise a front plate 702, a plurality of PV cells (not visible) disposed beneath the front plate 702 that can be arranged in rows, a plurality of spacers 704—including a bottom spacer 704A and top spacer 704B—interposed among the rows of PV cells, a backsheet 706, and a power conversion device 708 redundantly connected to PV cells of PV module 700 via bottom spacer 704A.

Although not shown in FIG. 7A, the PV module 700 can further include an adhesive layer, buffer layer and/or other components included in the PV module 100 of FIGS. 1A-1C.

The power conversion device 708 can include a plurality of power conversion circuits 710 individually connected to the PV cells of PV module 700 via bottom spacer 704A. The power conversion circuits 710 and PV cells of PV module 700 can be commonly grounded to the backsheet 706. For instance, power conversion circuits 710 can be grounded to the backsheet 706 via a ground connection 712 than can include solder, or the like, interconnecting the power conversion circuits 710 to the backsheet 706. Similarly, the PV cells of PV module 700 can be grounded to the backsheet 706 via a ground connection 714 that can include solder, or the like, interconnecting the backsheet 706 to the PV cells of PV module 700 via top spacer 704B.

Additionally, the power conversion circuits 710 can be individually connected to a supply line 716, a neutral line 718, and a digital control line 720. The digital control line 720 can couple a control module 722 to each of power conversion circuits 710. Alternately or additionally, each of power conversion circuits 710 can include corresponding control modules, with the control module 722 comprising a master control module.

In addition, the PV module 700 can include an active row-balancing device 724 providing active row-balancing of current through the rows of PV cells of PV module 700. The active row-balancing device 724 can include a plurality of active electronic devices 726 interconnected between the rows of PV cells of PV module 700. Each active electronic device 726 can comprise a field effect transistor ("FET"), a gate driver, an inductor, a capacitor, a bypass diode, a microcontroller, or the like or any combination thereof. Alternately or additionally, the active electronic devices 726 can comprise consumer electronics.

In some embodiments, the active electronic devices 726 can be coupled to corresponding spacers 704 between adjacent rows of PV cells such that there is a 1:1 correspondence between active electronic devices 726 and rows of PV cells, allowing each active electronic device 726 to actively row-balance a single corresponding row of PV cells.

Figure 7B:
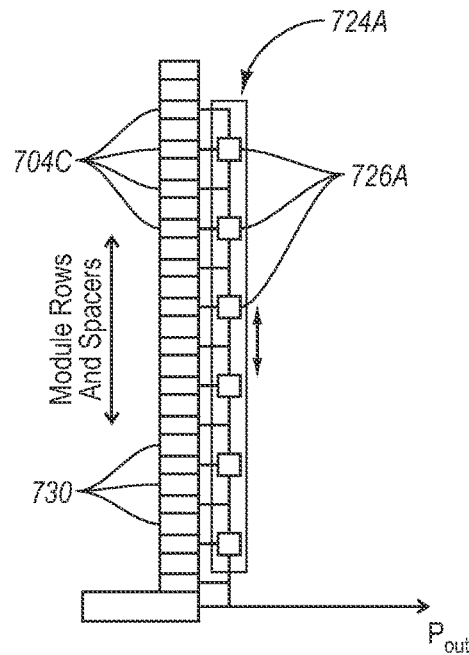
FIG. 7B discloses aspects of another example PV module that can include a redundantly connected power conversion device and an active row-balancing device.

Alternately, FIG. 7B discloses, in simplified form, an arrangement in which a plurality of active electronic devices 726A of an active row-balancing device 724A can be coupled to spacers 704C in an alternating fashion that skips every other spacer 704C, such that there is a 1:2 correspondence between active electronic devices 726A and rows 730 of PV cells, allowing each active electronic device 726A to actively row-balance two or more rows 730 of PV cells. Alternately or additionally, the active electronic devices 726A can be coupled to spacers 704C in an alternating fashion that skips every two spacers 704C, every three spacers 704C, or the like or any combination thereof Returning to FIG. 7A, each of the active electronic devices 726 can be coupled to the supply line 716 such that the active row-balancing device 724 can be powered by the conditioned power output from power conversion device 708. Alternately or additionally, each of the active electronic devices 726 can be coupled to the digital control line 720 to allow the control module 722 of power conversion device 708 to control operation of the active electronic devices 726.

In operation, the active electronic devices 726 can generally feed current into blocked rows of PV cells via spacers 704 in order to balance current in the PV module 700 and maximize the power output of the PV module 700 under varying non-uniform illumination conditions. In some embodiments, the active row-balancing device 724 can include sensors or other devices to detect if a row is blocked. When a blocked row is detected, the active row-balancing device can instruct a corresponding active electronic device 726 to feed current into the blocked row.

Figure 8:
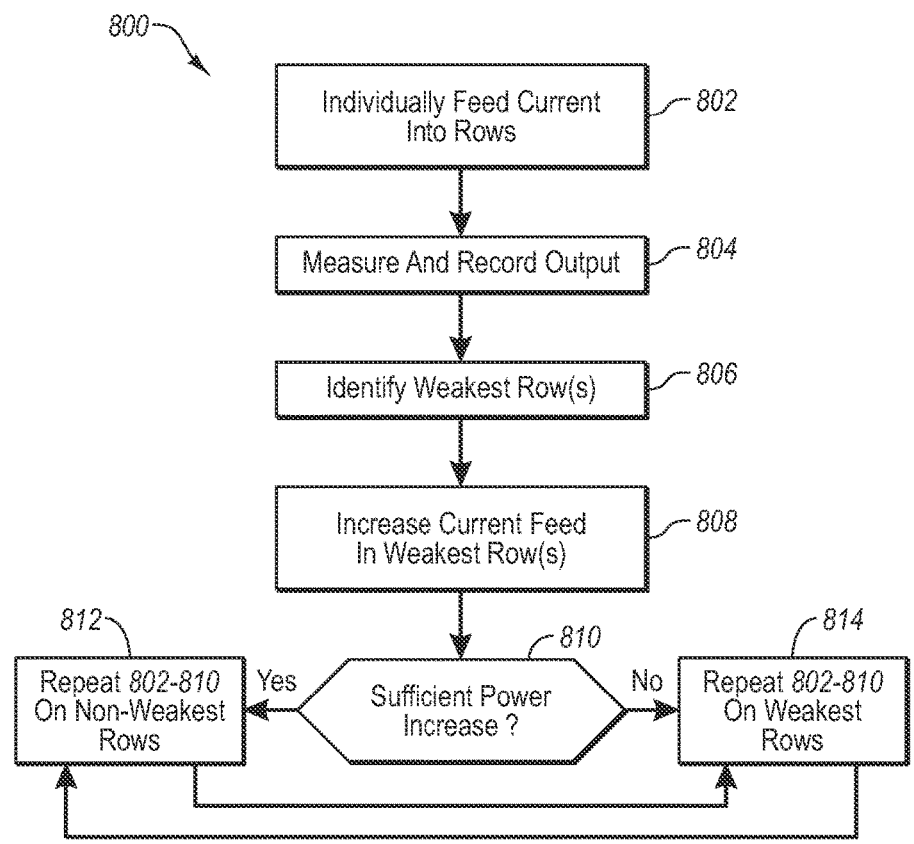
FIG. 8 discloses an example method for active row-balancing of current in a PV module.

Alternately or additionally, active row-balancing device 724 and power conversion device 708 can implement a row-balancing method, such as the example row-balancing method 800 of FIG. 8. With combined reference to FIGS. 7A and 8, the method 800 can begin by the active electronic devices 726 individually feeding 802 current into each row of PV cells in the PV module 700 in, e.g., a round-robin fashion that begins with the top row of PV cells and continues down the PV module 700 to the bottom row of PV cells. In some embodiments, the control module 722 can individually instruct, via digital control line 720, each active electronic device 726 when to feed 802 current into a row of PV cells. The current fed 802 into each row can be drawn by the active electronic devices 726 from the conditioned output of power conversion device 708 provided on supply line 716. In some cases, the current fed 802 into each row can comprise approximately 10% of the current available on supply line 716, or more or less than 10%.

Each time current is fed 802 into a row of PV cells, the conditioned power output of power conversion device 708 can be measured and recorded 804. For instance, the control module 722 can measure the power output on the supply line 716 each time a row is fed 802 current and can record 804 the measured power output in volatile or non-volatile memory of the control module 722. The power output measurements can be stored in a table or other data structure that correlates the measured power output with a particular row of PV cells that was being fed current by an active electronic device 726 at the time the measurement was made.

After measuring and recording 804 power output each time a different row is fed current, the weakest row can be identified 806. In this case, the largest power output measurement can correspond to the weakest row, as the power output of power conversion device 708 can increase the most when current is fed into the weakest row. In some embodiments, the control module 722 can identify 806 the weakest row by comparing the power output measurements stored in memory.

The method 800 can continue by increasing and maintaining 808 the current feed in the weakest row. For example, the control module 722 can instruct the active electronic device 726 corresponding to the weakest row to increase the current feed into the weakest row beyond what was fed into the weakest row at step 802.

After increasing and maintaining 808 the current feed in the weakest row, the control module 722 can determine 810 whether the power output of power conversion device 708 has increased beyond a predetermined threshold. This can include measuring the power output after performing step 808 and comparing the power output to an initial power output measured before feeding current into any of the rows.

If the control module 722 determines 810 that the power output has increased beyond a predetermined threshold, steps 802-810 can be repeated 812 on every row except the weakest rows to identify one or more additional other weakest rows. However, if the control module 722 determines 810 that the power output has not increased beyond a predetermined threshold, steps 802-810 can be repeated 814 on the previously identified weakest rows to optimize the current feed in the identified weakest rows.

The method 800 can then alternate back and forth between steps 812 and 814 to identify additional weak rows and optimize the current feed in the identified weakest rows. Alternating back and forth between steps 812 and 814 can allow the conditioned power output of PV module 700 to be optimized when the weakest rows are changing from one moment to the next due to, e.g., changing illumination conditions or the like. Alternately or additionally, measuring the conditioned power output of PV module 700, rather than measuring current and/or other parameters at each of the rows of PV module 700 can avoid the cost of added components in the active row-balancing device 724 to measure each row and/or can avoid power loss associated with measuring current or other parameters at each of the rows of PV module 700.

As mentioned above, the active row-balancing device 724 can be powered by the conditioned power output of the PV module 700. The powering of the active row-balancing device 724 using the conditioned power output of PV module 700 can reduce the conditioned power output of the PV module 700. However, the gain in conditioned power output of the PV module 700 when the rows of PV cells are actively balanced can be greater than the loss of conditioned power output required to power the active row-balancing device 724. Thus, active row-balancing using an active row-balancing device 724 that is powered by the PV module 700 can result in a net gain in conditioned power output of the PV module 700 compared to operating the PV module 700 with unbalanced rows.

IV. Example Control Algorithm

Figure 9:
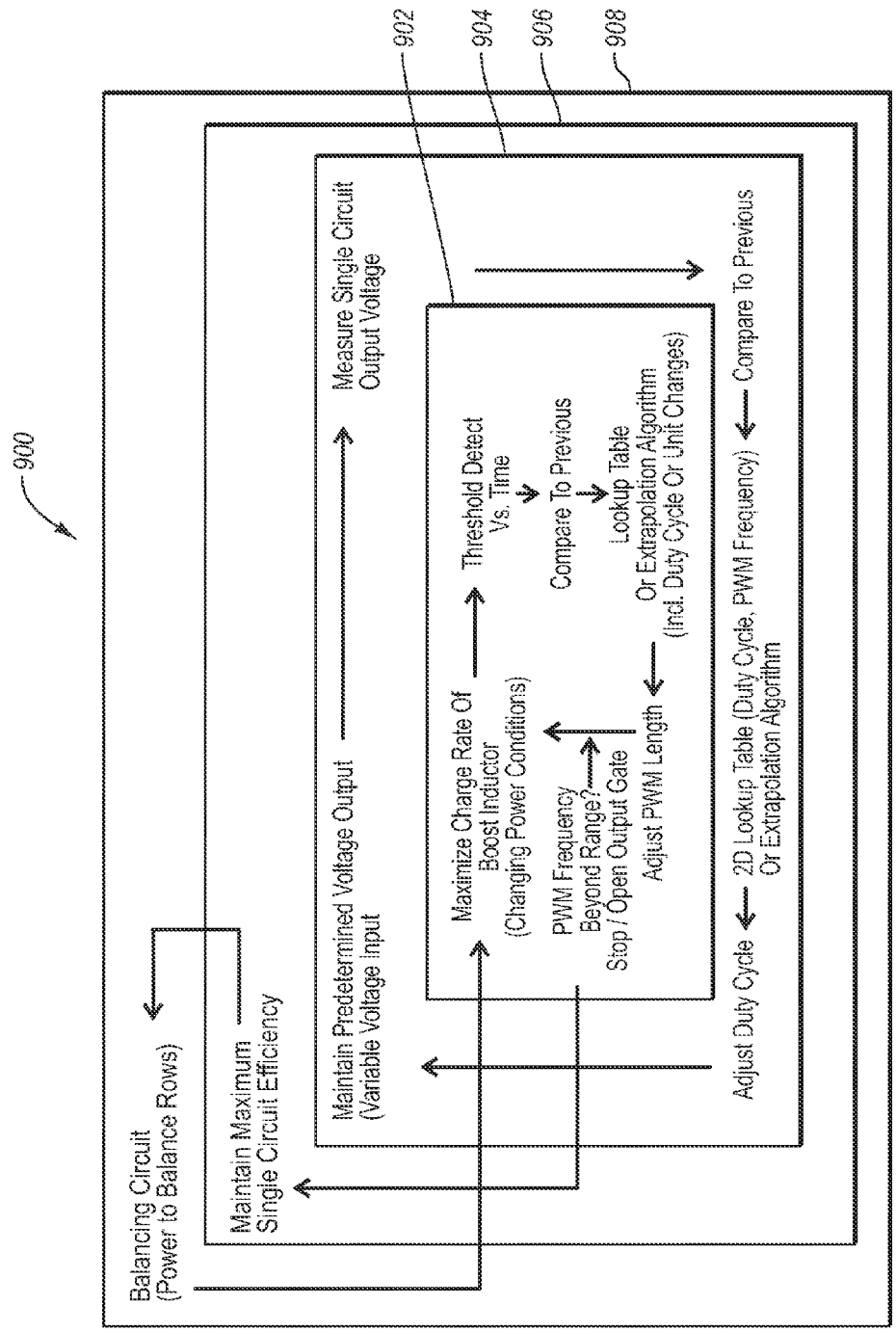
FIG. 9 discloses a nested control loop that can be implemented in a PV module to maximize power output of the PV module.

Embodiments of the invention can include PV modules that implement one or more control algorithms to maximize power output of the PV Module. The control algorithms can be implemented by one or more control modules included in a power conversion device or active row-balancing device of the PV module. One embodiment of an example nested loop control algorithm 900 is disclosed in FIG. 9 and will be discussed in the context of the PV module 700 of FIG. 7A.

The control algorithm 900 can include a plurality of control loops 902, 904, 906 and 908. In the present example, each of control loops 902-908 can include a method for controlling, respectively, maximum peak power, voltage gain, power conversion circuit efficiency, and row-balancing. In some instances, the control loops 902 and 904 can be implemented within each power conversion circuit 710, while the control loops 906 and 908 can be implemented across power conversion circuits 710 and/or across active electronic devices 726.

For example, the control loop 902 can include a method for controlling maximum peak power of the PV module 700 and can be implemented by a control module within each power conversion circuit 710, or by a shared control module for each of the power conversion circuits 710 controlled by the shared control module. As explained above, controlling and maintaining maximum peak power of a PV module can depend on the charge rate of the inductors in the power conversion circuits of the PV module.

The control loop 902 can include a step of continuously monitoring the charge rate of the inductors in power conversion circuit 710. Power conversion circuit 710 can include a threshold detect such that when the charge rate of the inductor crosses a predetermined threshold, the charge rate is compared to a previous charge rate and/or fed into a lookup table of charge rates. Based on data in the lookup table, the power conversion circuit 710 can adjust up or down the switching frequency, e.g., the frequency of the PWM control signal, of the switch of power conversion circuit 710. Changes to the switching frequency of the PWM control signal can affect changes in the charge rate of the inductor which the power conversion circuit 710 can continue to monitor and maximize.

The control loop 904 can include a method for regulating the stepped up voltage of each power conversion circuit 710 to a predetermined voltage. As explained above, the voltage gain of a power conversion circuit can depend on the duty cycle and/or switching frequency of the PWM control signal switching the switch of the power conversion circuit on and off. The control loop 904 can include the power conversion circuit 710 measuring the output voltage of the power conversion circuit 710 and comparing it to one or more previous measurements. Alternately or additionally, the measured output voltage can be fed into a lookup table of output voltages. Based on data in the lookup table, the power conversion circuit 710 can adjust the duty cycle of the PWM control signal up or down to adjust the output voltage towards a predetermined voltage.

The control loop 906 can include a method for controlling and maximizing the efficiency of power conversion circuits for power conversion device 708. In some embodiments, the control loop 906 can incorporate the circuit switching method disclosed above with respect to FIGS. 5A-5C. Alternately or additionally, the control loop 906 can be implemented by a master control module, such as the control module 722, that collects information from each of power conversion circuits 710. The collected information can include operating parameters for the power conversion circuits 710 time, including operating and/or operating temperature. Further, the collected information can be used by the control module 722 to determine how many of power conversion circuits 710 to operate at a time and/or how to on/off cycle the power conversion circuits 710.

The control loop 908 can include a method for controlling row-balancing in the rows of PV module 700. The control loop 908 can incorporate the method 800 of FIG. 8 and can be implemented by the control module 722 and active electronic devices 726.

As mentioned above, each of control loops 902-908 can be implemented, at least in part, by a control module included within each power conversion circuit 710 and/or a separate control module 722. In either or both instances, the control module can include firmware that the control module executes to, e.g., maintain the maximum peak power of the power conversion circuit 710, regulate the stepped up voltage of the power conversion circuit 710 to a predetermined voltage, maximize the efficiency of the power conversion circuits 710, or actively row-balance current in the PV module 700.

In some embodiments of the invention, implementation of the nested control loop 900 in the PV module 700 can maximize the power output of the PV module 700 under varying illumination and operating conditions.

V. Example Photovoltaic Module Calibration

Embodiments of the invention can include PV Modules configured to communicate, either wirelessly or via a hardwired connection, with one or more external devices. For instance, although not shown, the PV module 700 can include a communication interface 732 that allows the PV module 700 to digitally communicate bi-directionally with an external communication device, such as a computer, cell-phone, or other external device, over a hardwired or wireless connection established via the communication interface 732.

In some embodiments of the invention, the communication interface 732 can allow the PV Module 700 to communicate using one or more defined communication protocols now known or later developed. For instance, the PV module 700 can communicate using one or more of 1-wire protocol, Internet Protocol ("IP"), Ethernet, Fibre Channel, Transmission Control Protocol ("TCP"), TCP/IP, Sonet, code division multiple access ("CDMA"), cellular protocols, Wireless Ethernet, 802.xx protocols, or the like or any combination thereof. Whereas some communication protocols can require that communicating devices include an identifier, the PV module 700 can include an identifier, such as a unique serial identifier, an IP address, a cellular address, or other identifier, that the communication interface 732 can use when establishing communication with an external device.

In some embodiments of the invention, inclusion of a communication interface 732 can facilitate calibration of the PV module 700. For instance, the communication interface 732 can allow the PV module 700 to download different sets of computer executable instructions, comprising software or firmware, that enable the PV module 700 to self-calibrate.

Figure 10:
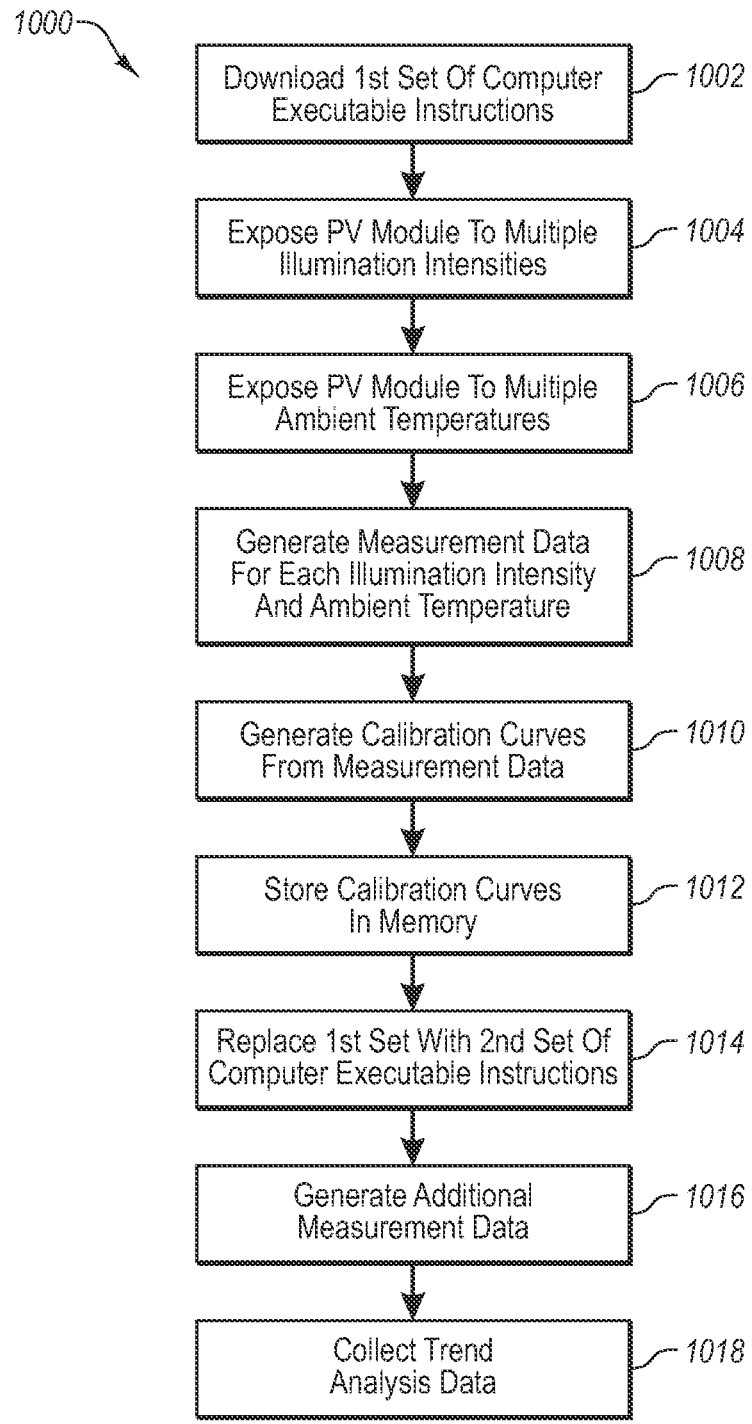
FIG. 10 discloses an example method for calibrating a PV module.

One example of a method 1000 for self-calibrating PV module 700 is disclosed in FIG. 10. The method 1000 can begin by downloading 1002 a first set of computer executable instructions via communication interface 732 to PV module 700. The PV module 700 can include a volatile or non-volatile memory module 734 that can be accessed by control module 722 wherein the first set of computer executable instructions can be saved. Generally speaking, the first set of computer executable instructions can control operation of the PV module 700 during the calibration method 1000 and can, among other things, develop calibration constants for the PV module 700. Alternately or additionally, the first set of computer executable instructions can internally test the PV module 700, test safety features of the PV module 700, simulate stress conditions for the PV module 700, or the like or any combination thereof.

At step 1004, the PV module 700 can be exposed to multiple illumination intensities. At step 1006, the PV module 700 can be exposed to multiple ambient temperatures. For instance, the PV module 700 can be exposed to one illumination intensity while being exposed to multiple ambient temperatures, then exposed to another illumination intensity while repeating the exposure to the multiple ambient temperatures, and so on.

The method 1000 can continue by generating 1008 measurement data for each illumination intensity and ambient temperature the PV module 700 is exposed to. The measurement data can be generated internally to the PV module by the control module 722 and/or control modules included in each of power conversion circuits 710, for example. Further, the measurement data can be generated by the control module 722 or other control modules in response to executing the first set of computer executable instructions.

The measurement data generated at step 1008 can be representative of, for each illumination intensity and ambient temperature, an electrical resistance of each power conversion circuit 710 and/or for the PV module 700, a power output of each power conversion circuit 710 and/or for the PV module 700, a peak power current for each power conversion circuit 710 and/or for the PV module 700, a peak power voltage for each power conversion circuit 710 and/or for the PV module 700, a local circuit phase of each power conversion circuit 710 and of the PV module 700, or the like or any combination thereof. Alternately or additionally, the measurement data can be representative of current and voltage characteristics of the PV module 700, uniformity of current and voltage across the PV module 700, row-balancing of the PV module 700 at different illumination intensities, or the like.

At step 1010, execution of the first set of computer executable instructions by control module 722 can further cause the control module 722 to generate a plurality of calibrations curves from the measurement data that allow for predicting expected changes of operating parameters of the PV module 700 over time and changing environmental conditions. For instance, one type of calibration curve may indicate how the power output of a power conversion circuit 710 varies as a function of ambient temperature. Such a calibration curve might be used by control module 722 to predict how the power output of the power conversion circuit 710 will change in the field when the power conversion circuit 710 is exposed to ambient temperatures above or below the ambient temperatures of step 1006.

Alternately or additionally, another type of calibration curve may indicate the maximum current draw from each power conversion circuit 710 at peak operation. The maximum current draw per power conversion circuit 710 can depend on inherent characteristics of each power conversion circuit 710, illumination intensity and/or uniformity, location of each power conversion circuit 710, and the like. Such a calibration curve might be used by control module 722 in maintaining maximum peak power of the PV module 700. Alternately or additionally, other types of calibration curves can include IV curves or PV curves for each power conversion circuit 710 at different illumination intensities and/or ambient temperatures.

Each calibration curve can be stored 1012 in memory module 734 as a table or other data structure and can later be used by control module 722 in the field to transform field measurements into physical data, or for operational control, diagnostics, or other uses. In this case, the control module 722 can calculate future performance of the photovoltaic module 700 based on the information, such as calibration curves, stored in the memory module 734 and/or on information that can be stored externally and accessed via communication interface 732.

At step 1014, the first set of computer executable instructions can be replaced with a second set of computer executable instructions by erasing the first set of computer executable instructions from memory module 734 and downloading the second set of computer executable instructions via communication interface 732. Generally speaking, the second set of computer executable instructions can control operation of the PV module 700 in the field. For instance, the second set of computer executable instructions can cause the control module 722 and/or other control modules included in power conversion device 708 to implement the nested control loop 900 of FIG. 9 to maintain maximum peak power, regulate voltage gain, maximize efficiency of power conversion circuits 710, and/or actively row-balance.

Alternately or additionally, the method 1000 can include generating 1016 additional measurement data in the factory and/or in the field. The additional measurement data can be representative of one or more of the following parameters for the PV cells of PV module 700 in aggregate: normalized maximum power output, short circuit current, open circuit voltage, maximum peak power current, maximum peak power voltage, parasitic resistance, shunt resistance, reverse current bias, reverse voltage bias, and the like or any combination thereof. Alternately or additionally, the additional measurement data can be representative of one or more of the following parameters for each the power conversion circuits 710: frequency response, capacitance, inductance, circuit tuning parameters, switching times, or phasing.

Optionally, the method 1000 can include the control module 722 collecting and storing 1018 trend analysis data from one or more devices external to the control module 722. For instance, the control module 722 can collect trend analysis data from the power conversion circuits 710, the active row-balancing device 724, and/or a clock, thermometer, light sensor, voltage sensor, or other device that can be included in the power conversion device 708, elsewhere on the PV module 700, or can be provided as external devices. The trend analysis data can be representative of the time and date, the ambient temperature of the PV module 700 and/or the operating temperature of individual power conversion circuits 710, the output voltage of power conversion device 708, the amount of current imbalance in the supply line 716 and neutral line 718, the amount of power drawn by active row-balancing device 724 to balance current in the rows of PV module 700, the failure rate of power conversion circuits 710, or the like or any combination thereof.

Figure 11:
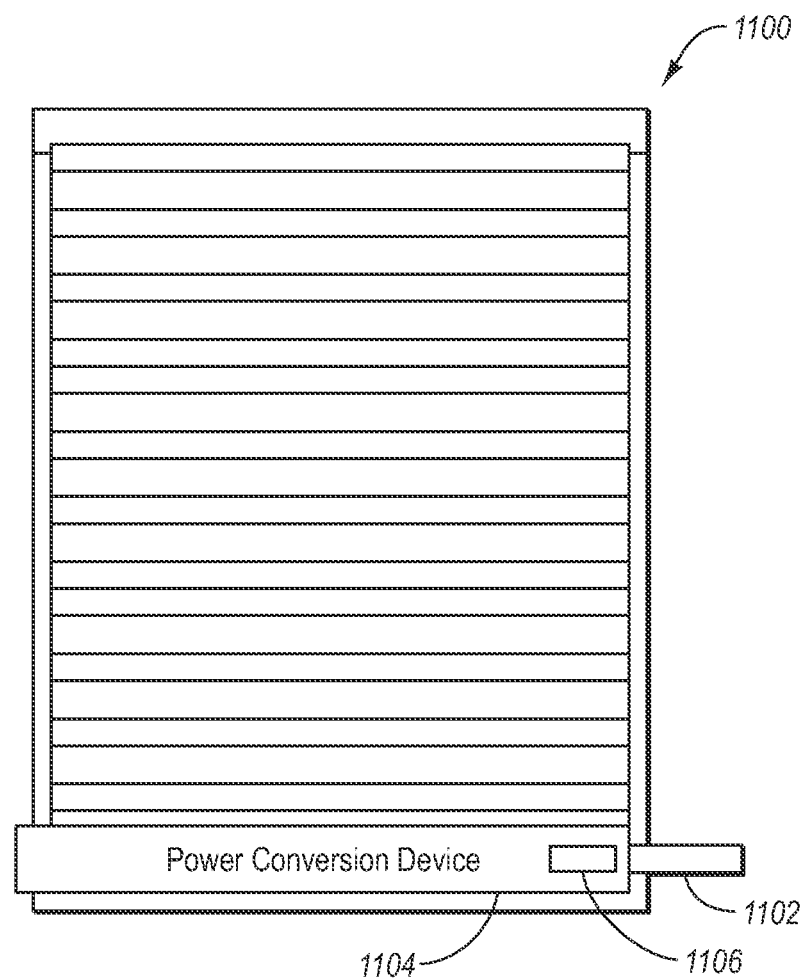
FIG. 11 discloses a PV module that can connect to a loopback device.

In some embodiments of the invention, the measurement data and/or trend analysis data generated and collected at steps 1008, 1016 and 1018 that is used in calibrating the PV module 700 can be generated internally by one or more components within the PV module 700. Alternately or additionally, at least some of the measurement data and/or trend analysis data generated and collected at steps 1008, 1016 and 1018 can be collected from a loopback device that is external to the PV module 700. For instance, FIG. 11 discloses an example PV module 1100 that may correspond to the PV module 700 of FIG. 7A. As shown in FIG. 11, the PV module 1100 can be connected to a loopback device 1102. More particularly, the PV module 1100 can include a power conversion device 1104 with a communication interface 1106. In this case, the loopback device 1102 can communicate with the power conversion device 1104 via communication interface 1106.

The loopback device 1102 can generate data and transmit the data to power conversion device 1104 via communication interface 1106. The loopback device 1102 can comprise a global positioning system ("GPS") device, a voltage calibration device, a current calibration device, an Ethernet port or wireless communication port, an illumination calibration device such as a photodiode, a tilt sensor, an alignment sensor, or the like or any combination thereof.

Some of the loopback devices 1102 can be used to provide operating conditions to the PV module 1100 at an installation site. For instance, a GPS device can provide GPS coordinates to the PV module 1100 so that the PV module 1100 knows where it is and what illumination conditions to expect. Alternately or additionally, a tilt or alignment sensor can provide the PV module 1100 with tilt or alignment angle of the PV module after installation.

In some instances, the measurement data provided by loopback device 1102 can comprise data that may not change after installation of the PV module 1100 at an installation site. Further, one or more of the loopback devices 1102 described herein may comprise relatively costly devices. Accordingly, using an external loopback devices 1102 after installation of PV module 1100 to provide PV module 1100 with measurement data that is unlikely to change over time can reduce the cost of PV module 1100 without reducing the functionality of PV module 1100.

Alternately or additionally, the loopback device 1102 can provide an operating code to the PV module 1100 that enables operation of the PV module 1100. For instance, firmware implemented by a control module in the PV module 1100 can require the operating code to activate the PV module 1100. The PV module 1100 can be sent to an installation site without the operating code. After installing the PV module 1100, the operating code can be downloaded to the PV module 1100 to activate the PV module 1100 for operation. If, however, the PV module 1100 is stolen from the installation site or elsewhere without receiving the operating code, the lack of the operating code can render the PV module 1100 non-operational, which may provide some measure of theft-deterrence.

Figure 12B:
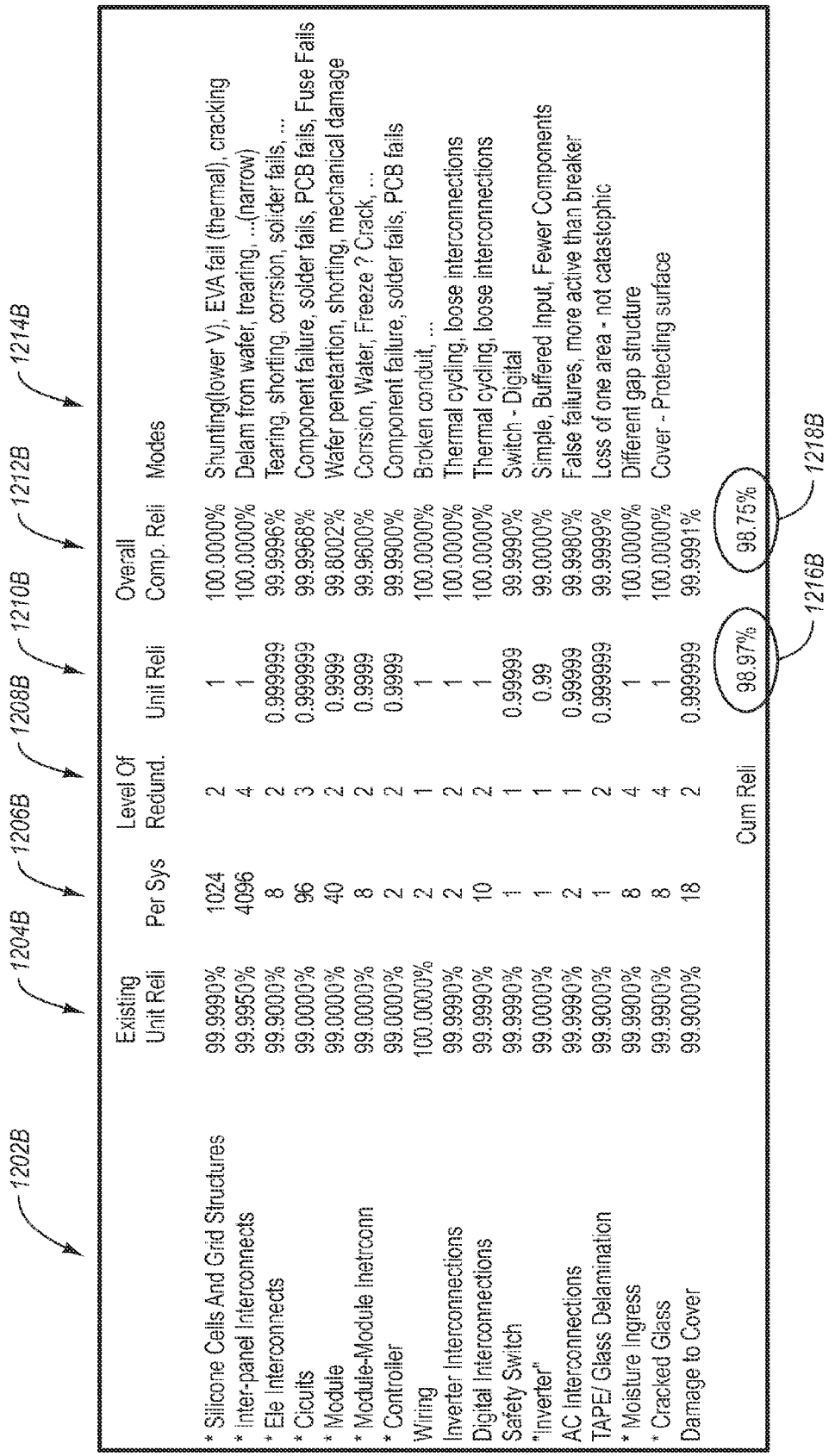

Turning next to FIGS. 12A and 12B, an example reliability study is disclosed for a conventional 2 kW PV system comprising a plurality of conventional PV modules, and an example 2 kW PV system comprising PV modules with redundant electronics according to embodiments of the invention. In particular, FIG. 12A includes reliability data for the conventional PV system, and FIG. 12B includes reliability data for the PV system with redundant electronics.

The first column 1202A, 1202B in each of FIGS. 12A and 12B identifies a plurality of components that can be included in each PV system of FIGS. 12A and 12B. The second column 1204A, 1204B identifies the individual reliability of each of the units identified in column 1202A, 1202B expressed as a percentage. The third column 1206A, 1206B identifies the quantity of each unit identified in column 1202A, 1202B that is included in the PV systems of FIGS. 12A, 12B. The fourth column 1208A, 1208B identifies the level of redundancy in the PV systems of FIGS. 12A, 12B of each unit identified in column 1202A, 1202B. The fifth column 1210A, 1210B identifies the individual reliability of each of the units identified in column 1202A, 1202B expressed as a decimal. The sixth column 1212A, 1212B identifies the collective reliability of each unit identified in column 1202A, 1202B, taking into account the quantity and redundancy of each unit in the corresponding PV system. The seventh column 1214A, 1214B identifies various failure modes for each of the units identified in column 1202A, 1202B.

In addition, each of FIGS. 12A and 12B includes two measures of cumulative reliability. In FIG. 12A, a first measure of cumulative reliability 1216A identifies the cumulative individual reliability of the units included in column 1202A. A second measure of cumulative reliability 1218A identifies the cumulative reliability of the PV system of FIG. 12A as a whole, taking into account the reliability, quantity, and redundancy of each unit included in the PV system of FIG. 12A.

Similarly, in FIG. 12B a first measure of cumulative reliability 1216B identifies the cumulative individual reliability of the units included in column 1202B. A second measure of cumulative reliability 1218B identifies the cumulative reliability of the PV system of FIG. 12B as a whole, taking into account the reliability, quantity, and redundancy of each unit included in the PV system of FIG. 12B.

As can be seen from a comparison of the second measures of cumulative reliability 1218A and 1218B, the PV system comprising redundant electronics has a reliability of 98.75%, which is significantly higher than the 85.89% reliability of the conventional PV system. Accordingly, the inclusion of redundant electronics and a redundant panel and interconnection structure can significantly improve the reliability of a PV system.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, solid state NAND- or NOR-based flash media, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of calibrating a photovoltaic module, comprising:
   downloading a first set of computer executable instructions onto a non-transitory computer-readable medium within a photovoltaic module comprising an array of photovoltaic cells, the photovoltaic module further comprising a power conversion device redundantly connected to the array of photovoltaic cells, the power conversion device including a plurality of redundant power conversion circuits, the first set of computer executable instructions configured to control operation of the photovoltaic module during calibration;
   exposing the photovoltaic module to multiple illumination intensities;
   exposing the photovoltaic module to multiple ambient temperatures including, during exposure of the photovoltaic module to each of the multiple illumination intensities, exposing the photovoltaic module to each of the multiple ambient temperatures such that the photovoltaic module is exposed to each of the multiple ambient temperatures during exposure to each given one of the multiple illumination intensities,
   generating measurement data for each illumination intensity and ambient temperature, the measurement data representative of one or more of:
      an electrical resistance of each power conversion circuit;
      a power output of each power conversion circuit;

a peak power current of each power conversion circuit;
a peak power voltage of each power conversion circuit; and
a local circuit phase of each power conversion circuit;
generating a plurality of calibration curves from the measurement data;
storing the plurality of calibration curves in a memory of the photovoltaic module, the plurality of calibration curves allowing a control module of the photovoltaic module to transform measurements in an operating environment into representative data; and
replacing the first set of computer executable instructions stored on the non-transitory computer-readable medium with a second set of computer executable instructions configured to control operation of the photovoltaic module in the operating environment.

2. The method of claim 1, wherein the measurement data is generated internally within the photovoltaic module.

3. The method of claim 1, wherein the measurement data includes data representative of one or more of: normalized maximum power output of the photovoltaic module, short circuit current of the photovoltaic module, open circuit voltage of the photovoltaic module, maximum peak power current of the photovoltaic module, maximum peak power voltage of the photovoltaic module, parasitic resistance of the photovoltaic module, shunt resistance of the photovoltaic module, reverse current bias of the photovoltaic module, reverse voltage bias of the photovoltaic module, frequency response of each power conversion circuit, capacitance of each power conversion circuit, inductance of each power conversion circuit, circuit tuning parameters of each power conversion circuit, switching times of each power conversion circuit, or phasing of each power conversion circuit.

4. The method of claim 3, further comprising collecting and storing trend analysis data representative of one or more of: a time and date, an ambient temperature of the photovoltaic module, an operating temperature of each of the power conversion circuits, an illumination intensity onto the photovoltaic module, an output voltage of the power conversion device, an amount of current imbalance between a supply line and a neutral line of the power conversion device, an amount of power drawn from the output of the power conversion device by an active-row balancing device, or a failure rate of the power conversion circuits.

5. The method of claim 4, wherein the measurement data and trend analysis data is generated internally within the photovoltaic module.

6. The method of claim 4, wherein at least some of the measurement data and trend analysis data is generated by and collected from a loopback device connected to the power conversion device.

7. The method of claim 6, wherein the loop back device comprises one or more of: a global positioning system device, a voltage calibration device, a current calibration device, an Ethernet port, a wireless communication port, or an illumination calibration device.

8. A method of calibrating a photovoltaic module, comprising:
executing a first set of computer executable instructions stored on a non-transitory computer-readable medium within a photovoltaic (PV) module, the photovoltaic module comprising an array of PV cells and a power conversion device redundantly connected to the PV cells, the power conversion device including a plurality of redundant power conversion circuits, the first set of computer executable instructions configured to control operation of the photovoltaic module during calibration;
generating measurement data for each of multiple illumination intensities to which the PV module is exposed by generating the measurement data while exposing the PV module to each of the multiple illumination intensities one at a time and during exposure to each of the multiple illumination intensities exposing the PV module to each of multiple ambient temperatures;
generating a plurality of calibration curves from the measurement data;
storing the plurality of calibration curves in a memory of the PV module, the plurality of calibration curves allowing a control module of the PV module to transform measurements in an operating environment into representative data; and
replacing the first set of computer executable instructions stored on the non-transitory computer-readable medium with a second set of computer executable instructions configured to control operation of the PV module in the operating environment.

9. The method of claim 8, wherein the measurement data is generated internally within the PV module.

10. The method of claim 8, wherein the generating the measurement data includes generating measurement data that is representative of one or more of:
an electrical resistance of each of the plurality of power conversion circuits;
a power output of each of the plurality of power conversion circuits;
a peak power current of each of the plurality of power conversion circuits;
a peak power voltage of each of the plurality of power conversion circuits; and
a local circuit phase of each of the plurality of power conversion circuits.

11. The method of claim 8, wherein the measurement data includes data representative of one or more of: normalized maximum power output of the PV module, short circuit current of the PV module, open circuit voltage of the PV module, maximum peak power current of the PV module, maximum peak power voltage of the PV module, parasitic resistance of the PV module, shunt resistance of the PV module, reverse current bias of the PV module, reverse voltage bias of the PV module, frequency response of power conversion circuits, capacitance of the power conversion circuits, inductance of the power conversion circuits, circuit tuning parameters of the power conversion circuits, switching times of the power conversion circuits, or phasing of the power conversion circuits.

12. The method of claim 11, further comprising collecting and storing trend analysis data representative of one or more of: a time and date, an ambient temperature of the photovoltaic module, an operating temperature of each of the power conversion circuits, an illumination intensity onto the photovoltaic module, an output voltage of the power conversion device, an amount of current imbalance between a supply line and a neutral line of the power conversion device, an amount of power drawn from the output of the power conversion device by an active-row balancing device, or a failure rate of the power conversion circuits.

13. The method of claim 12, wherein the measurement data and trend analysis data is generated internally within the photovoltaic module.

14. The method of claim 12, wherein at least some of the measurement data and trend analysis data is generated by and collected from a loopback device connected to the power conversion device.

15. The method of claim 14, wherein the loop back device comprises one or more of: a global positioning system device, a voltage calibration device, a current calibration device, an Ethernet port, a wireless communication port, or an illumination calibration device.

* * * * *